US012640764B2

(12) United States Patent
Selmeier et al.

(10) Patent No.: US 12,640,764 B2
(45) Date of Patent: May 26, 2026

(54) MODULE WITH PRE-FILTER

(71) Applicant: RF360 Singapore Pte. Ltd., Republic Plaza (SG)

(72) Inventors: Peter Selmeier, Munich (DE); Carsten Potratz, Munich (DE); Lasse Jalmari Toivanen, Espoo (FI); Florian Habel, Munich (DE); Thomas Bauer, Munich (DE); David Francis Berdy, San Diego, CA (US)

(73) Assignee: RF360 Singapore Pte. Ltd., Republic Plaza (SG)

( * ) Notice: Subject to any disclaimer, the term of this patent is extended or adjusted under 35 U.S.C. 154(b) by 597 days.

(21) Appl. No.: 18/170,242

(22) Filed: Feb. 16, 2023

(65) Prior Publication Data

US 2024/0283479 A1     Aug. 22, 2024

(51) Int. Cl.
H04B 1/38     (2015.01)
H03H 9/02     (2006.01)
H04B 1/18     (2006.01)

(52) U.S. Cl.
CPC ........... H04B 1/38 (2013.01); H03H 9/02015 (2013.01); H04B 1/18 (2013.01)

(58) Field of Classification Search
CPC .... H04B 1/005; H04B 1/0053; H04B 1/0057; H04B 1/006; H04B 1/18; H04B 1/38; H04B 1/40; H04B 1/44; H04B 1/48
See application file for complete search history.

(56) References Cited

U.S. PATENT DOCUMENTS

| | | | |
|---|---|---|---|
| 7,859,363 B2 | 12/2010 | Kiwitt et al. | |
| 11,405,059 B2 * | 8/2022 | Pehlke | H04B 1/18 |

(Continued)

FOREIGN PATENT DOCUMENTS

| | | |
|---|---|---|
| WO | WO-2017184759 A1 | 10/2017 |
| WO | WO-2019191625 A1 | 10/2019 |
| WO | WO-2019219412 A1 | 11/2019 |

OTHER PUBLICATIONS

International Search Report and Written Opinion—PCT/SG2024/050032—ISA/EPO—May 3, 2024.

*Primary Examiner* — Quochien B Vuong
(74) *Attorney, Agent, or Firm* — Norton Rose Fulbright US LLP

(57)     ABSTRACT

Aspects are provided for radio frequency (RF) front end modules. The radio frequency front end modules comprises a common antenna node, an antenna switch matrix (ASM) comprising an ASM first signal terminal and at least two ASM second signal terminals, the ASM first signal terminal being coupled with the common antenna node; at least two RF micro acoustic filters coupleable to the common antenna node via the ASM. At least a first RF micro acoustic filter of the at least two RF micro acoustic filters comprises a micro acoustic pre-filter comprising a pre-filter first signal terminal and a pre-filter second signal terminal, the pre-filter first signal terminal coupled with the ASM; and a micro acoustic main-filter comprising a main-filter first signal terminal and a main-filter second signal terminal. The micro acoustic pre-filter and the micro acoustic main-filter being separated by a signal line coupling the pre-filter second signal terminal to the main-filter first signal terminal, the micro acoustic pre-filter being on a different die than the micro acoustic main-filter and being coupled by the signal line.

30 Claims, 30 Drawing Sheets

(56)           References Cited

U.S. PATENT DOCUMENTS

| | | | |
|---|---|---|---|
| 11,539,385 B2 * | 12/2022 | Onodera ................. | H04B 1/10 |
| 12,250,012 B2 * | 3/2025 | Mori ........................ | H04B 1/00 |
| 2008/0309535 A1 * | 12/2008 | Le Guillou ............ | H03M 3/30 |
| | | | 341/143 |
| 2020/0106464 A1 | 4/2020 | Boyle | |

* cited by examiner

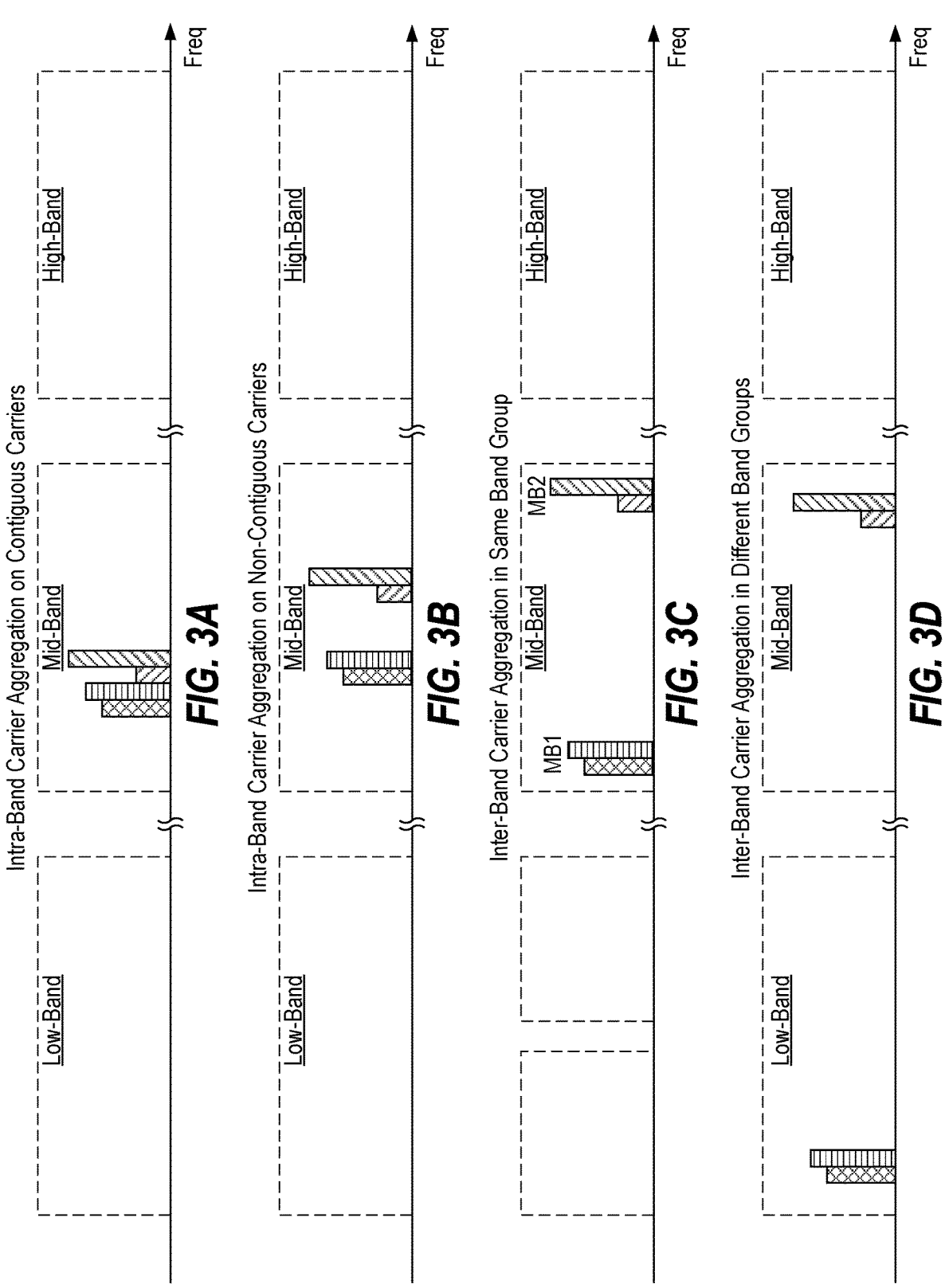

Bands 1, 3, 4, 23, 65, and 66

400

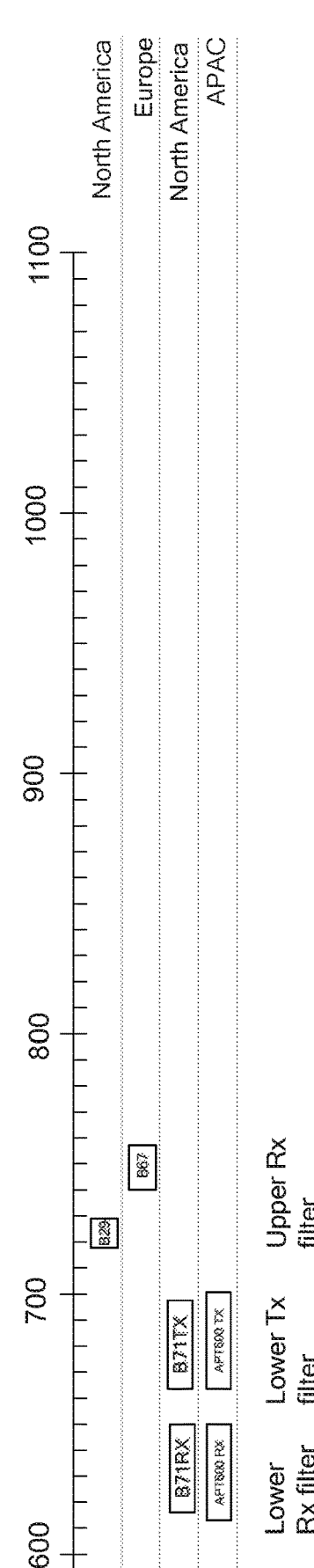
*FIG. 4H*

500
501
503
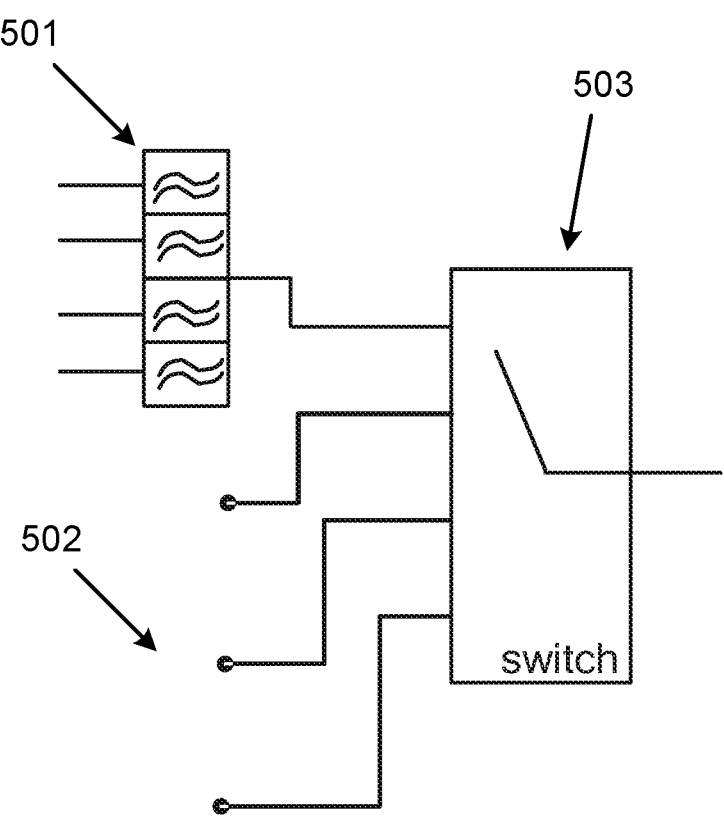
502
*FIG. 5A*

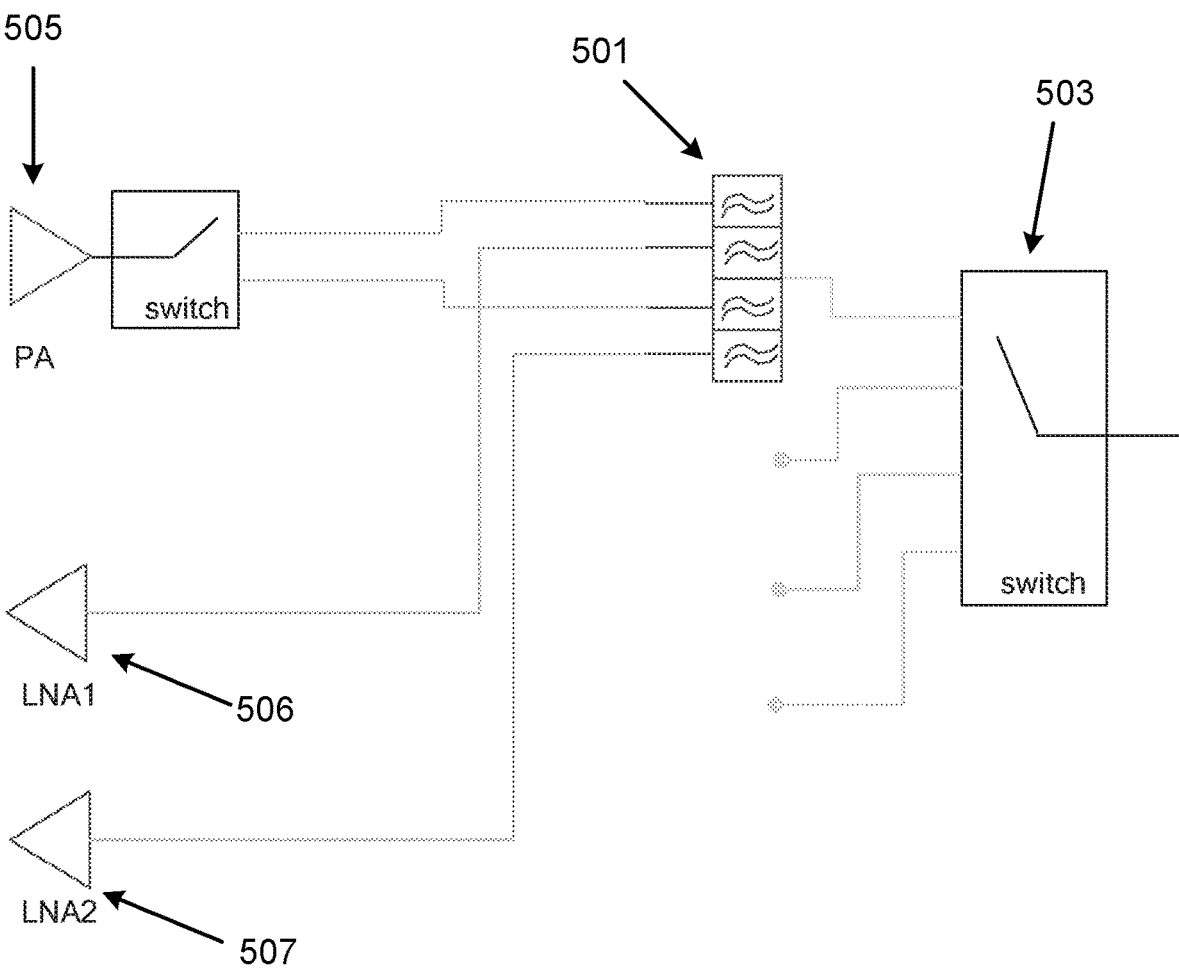
FIG. 5B

1800

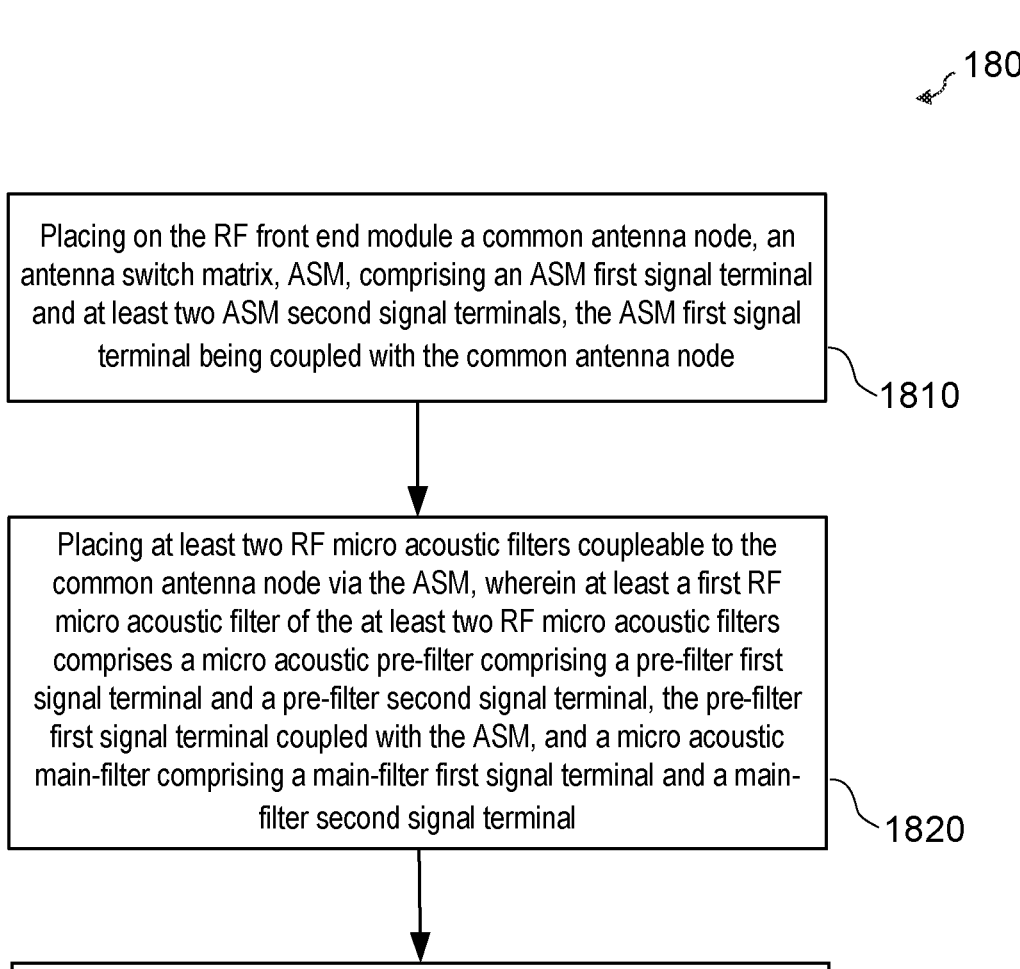

Placing on the RF front end module a common antenna node, an antenna switch matrix, ASM, comprising an ASM first signal terminal and at least two ASM second signal terminals, the ASM first signal terminal being coupled with the common antenna node

1810

Placing at least two RF micro acoustic filters coupleable to the common antenna node via the ASM, wherein at least a first RF micro acoustic filter of the at least two RF micro acoustic filters comprises a micro acoustic pre-filter comprising a pre-filter first signal terminal and a pre-filter second signal terminal, the pre-filter first signal terminal coupled with the ASM, and a micro acoustic main-filter comprising a main-filter first signal terminal and a main-filter second signal terminal

1820

Placing the micro acoustic pre-filter and the micro acoustic main-filter separated and the pre-filter second signal terminal being coupled to the main-filter first signal terminal by a signal line, the micro acoustic pre-filter being placed on a different die than the micro acoustic main-filter and being coupled by the signal line.

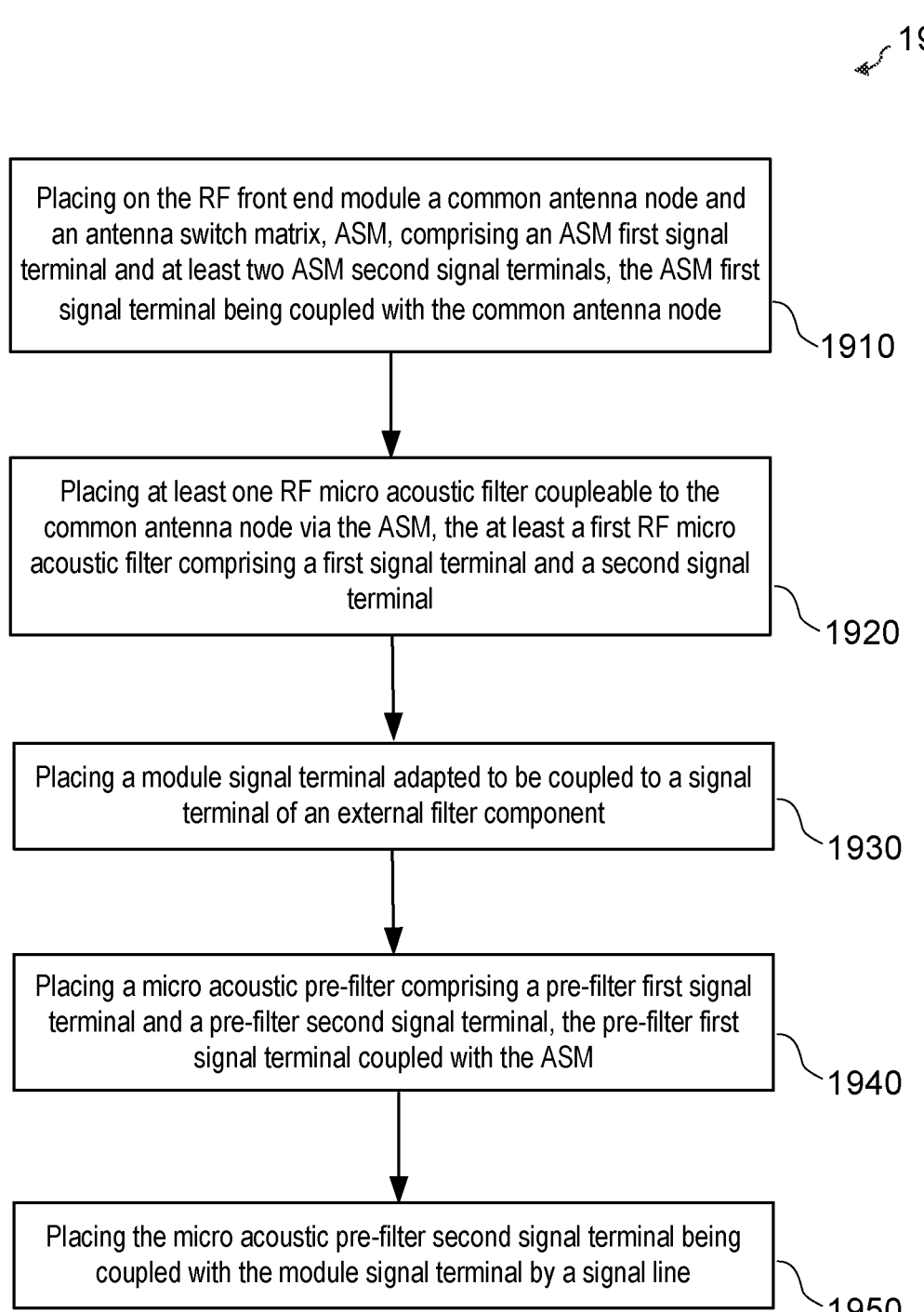

1900

Placing on the RF front end module a common antenna node and an antenna switch matrix, ASM, comprising an ASM first signal terminal and at least two ASM second signal terminals, the ASM first signal terminal being coupled with the common antenna node

1910

Placing at least one RF micro acoustic filter coupleable to the common antenna node via the ASM, the at least a first RF micro acoustic filter comprising a first signal terminal and a second signal terminal

1920

Placing a module signal terminal adapted to be coupled to a signal terminal of an external filter component

1930

Placing a micro acoustic pre-filter comprising a pre-filter first signal terminal and a pre-filter second signal terminal, the pre-filter first signal terminal coupled with the ASM

1940

Placing the micro acoustic pre-filter second signal terminal being coupled with the module signal terminal by a signal line

MODULE WITH PRE-FILTER

FIELD

The present disclosure relates generally to electronics, and more specifically to wireless communication systems, and more particularly to wireless communication devices having an antenna switch matrix architecture in a module (e.g., for a quadplexer or other multiplexer) for instance for filter configurations having a multiband multiplexer for use with carrier aggregation.

BACKGROUND

Wireless communication devices and technologies are becoming ever more prevalent, as are communication devices that operate at various ranges of frequencies, such as, for example, frequencies ranging from approximately 410 MHz to approximately 7125 MHz, referred to as New Radio (NR) sub-6 or sub-7 band. Communication devices that operate at millimeter-wave (mmW) frequencies of approximately 24250 MHz to approximately 52600 MHz or greater are also contemplated. Wireless communication devices generally transmit and/or receive communication signals. In a radio frequency (RF) transceiver, a communication signal is typically amplified and transmitted by a transmit section and a received communication signal is amplified and processed by a receive section. A communication device may include multiple transmitters, receivers and antennas and may be capable of communicating on multiple frequency bands simultaneously. The wireless device may also include multiple filters (e.g., bandpass filters) to transmit and/or receive RF signals in different frequency bands. The wireless device may also include a switching circuit between the antennas and the filters, in which the switching circuit is used to couple the antennas and the filters in any one of multiple configurations.

Some communication devices may also use what is referred to as a multiple input multiple output (MIMO) architecture. A MIMO architecture typically may use multiple transmitters, multiple receivers, and multiple antennas (or antenna elements).

A wireless communication device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated RF signal, amplify the modulated RF signal to obtain an amplified RF signal having the proper output power level, and transmit the amplified RF signal via an antenna to a base station. For data reception, the receiver may obtain a received RF signal via the antenna and may amplify and process the received RF signal to recover data sent by the base station.

A wireless device may support carrier aggregation (CA), which is simultaneous operation on multiple carriers. A carrier may refer to a range of frequencies used for communication and may be associated with certain characteristics. For example, a carrier may be associated with system information describing operation on the carrier. A carrier may also be referred to as a component carrier (CC), a frequency channel, a cell, etc. It is desirable to efficiently support carrier aggregation by the wireless device.

A RF Front End module must support many different CA cases (2CA, 3CA, 4CA or also 5CA). Depending on the number of CA bands, the same number of RF micro-acoustic filters are multiplexed and thus connected to one common antenna node.

Each of the multiplexed micro-acoustic filters are loaded by the imperfect out-of-band gamma of every other connected filter, leading to increased insertion loss. In some cases, one or more module filters are connected to the common antenna node only by a long transmission line due to the physically possible filter placement in the module. This long line introduces a phase shift, which must be compensated to provide an open phase to the other filters. The phase compensation comes along with additional losses.

Some RFFE modules need to support optional external filters, which must be multiplexed with internal filters. For good CA performance the out-of-band gamma of the internal and external filters need to be well aligned. But usually, the properties of the external filter and the external matching configuration is not known in the module design.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure relates to a radio frequency (RF) front end module. The radio frequency front end module comprises a common antenna node, an antenna switch matrix (ASM) comprising an ASM first signal terminal and at least two ASM second signal terminals, the ASM first signal terminal being coupled with the common antenna node; at least two RF micro acoustic filters coupleable to the common antenna node via the ASM. At least a first RF micro acoustic filter of the at least two RF micro acoustic filters comprises a micro acoustic pre-filter comprising a pre-filter first signal terminal and a pre-filter second signal terminal, the pre-filter first signal terminal coupled with the ASM; and a micro acoustic main-filter comprising a main-filter first signal terminal and a main-filter second signal terminal. The micro acoustic pre-filter and the micro acoustic main-filter being separated by a signal line coupling the pre-filter second signal terminal to the main-filter first signal terminal, the micro acoustic pre-filter being on a different die than the micro acoustic main-filter.

Another aspect of the disclosure relates to a radio frequency front end module. The radio frequency front end module comprises a common antenna node; an antenna switch matrix (ASM) comprising an ASM first signal terminal and at least two ASM second signal terminals, the ASM first signal terminal being coupled with the common antenna node; at least one RF micro acoustic filter coupleable to the common antenna node via the ASM; a module signal terminal adapted to be coupled to a signal terminal of an external filter component; and a micro acoustic pre-filter comprising a pre-filter first signal terminal and a pre-filter second signal terminal, the pre-filter first signal terminal coupled with the ASM, the micro acoustic pre-filter second signal terminal being coupled with the module signal terminal by a signal line.

Another aspect of the disclosure relates to a method for a radio frequency front end module. The method comprises placing on the RF front end module a common antenna node; an antenna switch matrix (ASM) comprising an ASM first signal terminal and at least two ASM second signal terminals, the ASM first signal terminal being coupled with the common antenna node; at least two RF micro acoustic filters coupleable to the common antenna node via the ASM. At least a first RF micro acoustic filter of the at least two RF micro acoustic filters comprises a micro acoustic pre-filter comprising a pre-filter first signal terminal and a pre-filter second signal terminal, the pre-filter first signal terminal coupled with the ASM; and a micro acoustic main-filter comprising a main-filter first signal terminal and a main-filter second signal terminal. The method further comprises placing the micro acoustic pre-filter and the micro acoustic main-filter to be separated from each other and the pre-filter second signal terminal being coupled to the main-filter first signal terminal by a signal line, the micro acoustic pre-filter being placed on a different die than the micro acoustic main-filter.

Another aspect of the disclosure relates to a method for a radio frequency front end module. The method comprises placing on the RF front end module a common antenna node; an antenna switch matrix (ASM) comprising an ASM first signal terminal and at least two ASM second signal terminals, the ASM first signal terminal being coupled with the common antenna node; at least one RF micro acoustic filter coupleable to the common antenna node via the ASM, the at least a first RF micro acoustic filter comprising a first signal terminal and a second signal terminal; a module signal terminal adapted to be coupled to a signal terminal of an external filter component; and a micro acoustic pre-filter comprising a pre-filter first signal terminal and a pre-filter second signal terminal, the pre-filter first signal terminal coupled with the ASM. The method further comprises placing the micro acoustic pre-filter second signal terminal being coupled with the module signal terminal by a signal line.

Another aspect of the disclosure relates to a radio frequency front end module. The radio frequency front end module comprises a common antenna node; means for antenna switching (MAS) comprising an MAS first signal terminal and at least two MAS second signal terminals, the MAS first signal terminal being coupled with the common antenna node; at least two means for micro acoustic filtering coupleable to the common antenna node via the MAS. At least first means for micro acoustic filtering of the at least two means for micro acoustic filtering comprises means for micro acoustic pre-filtering comprising a pre-filter first signal terminal and a pre-filter second signal terminal, the pre-filter first signal terminal coupled with the MAS; and means for micro acoustic main-filtering comprising a main-filter first signal terminal and a main-filter second signal terminal. The means for micro acoustic pre-filtering and the means for micro acoustic main-filtering being separated by a signal line coupling the pre-filter second signal terminal to the main-filter first signal terminal, the micro acoustic pre-filter being on a different die than the micro acoustic main-filter and being coupled by the signal line.

Another aspect of the disclosure relates to a radio frequency front end module. The radio frequency front end module comprises a common antenna node; means for antenna switching (MAS) comprising an MAS first signal terminal and at least two MAS second signal terminals, the MAS first signal terminal being coupled with the common antenna node. At least one means for micro acoustic filtering coupleable to the common antenna node via the MAS; a module signal terminal adapted to be coupled to a signal terminal of external means for filtering; and means for micro acoustic pre-filtering comprising a pre-filter first signal terminal and a pre-filter second signal terminal, the pre-filter first signal terminal coupled with the MAS, the micro acoustic pre-filter second signal terminal being coupled with the module signal terminal by a signal line.

BRIEF DESCRIPTION OF THE DRAWINGS

In the figures, like reference numerals refer to like parts throughout the various views unless otherwise indicated. For reference numerals with letter character designations such as "102$a$" or "102$b$", the letter character designations may differentiate two like parts or elements present in the same figure. Letter character designations for reference numerals may be omitted when it is intended that a reference numeral encompass all parts having the same reference numeral in all figures.

FIGS. 3A, 3B, 3C, and 3D are diagrams illustrating four examples of carrier aggregation types according to aspects of the present disclosure.

FIG. 4H is a diagram illustrating band combinations for a carrier aggregation scenario according to aspects of the present disclosure.

FIG. 5A is a schematic diagram of an example of a portion of a front-end circuit of a transceiver with a multiband multiplexer in accordance with aspects described herein.

FIG. 5B is a schematic diagram of another example of a portion of a front-end circuit of a transceiver with a multi-band multiplexer in accordance with aspects described herein.

FIG. 18 is a flowchart illustrating a method for manufacturing a radio frequency, RF, front end module according to certain aspects of the present disclosure.

FIG. 19 is a flowchart illustrating a further method for manufacturing a radio frequency, RF, front end module according to certain aspects of the present disclosure.

DETAILED DESCRIPTION

Figure 1:
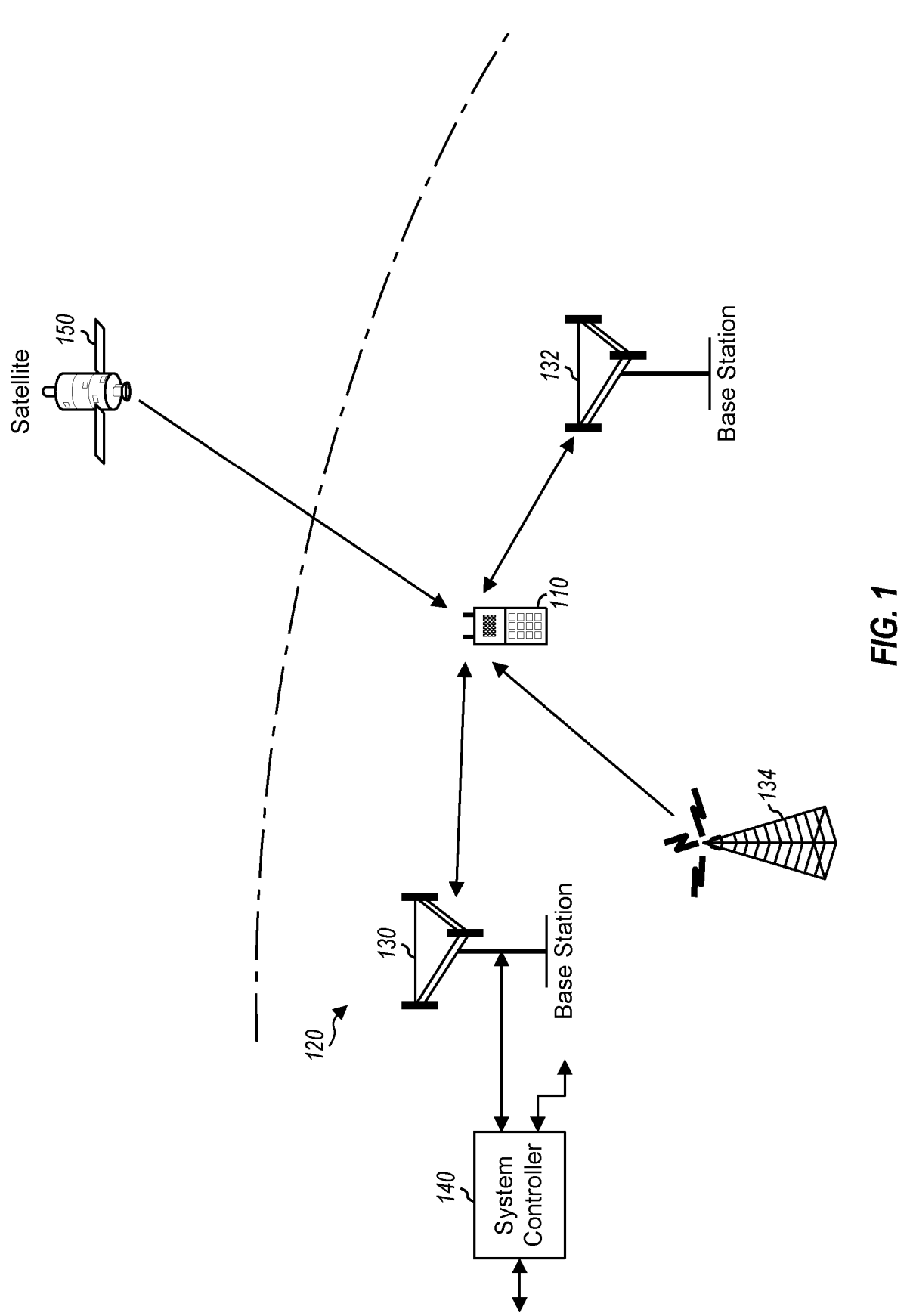
FIG. 1 is a diagram of wireless device communication in a wireless system according to an aspect of the present disclosure.

The detailed description set forth below in connection with the appended drawings is intended as a description of various aspects of implementations and is not intended to represent the only implementations in which the invention may be practiced. The detailed description includes specific details for the purpose of providing a thorough understanding of the described aspects. In some instances, some devices are shown in block diagram form. It is noted that the relative dimensions of the following figures may not be drawn to scale. Drawing elements that are common among the following figures may be identified using the same reference numerals.

The word "exemplary" is used herein to mean "serving as an example, instance, or illustration." Any aspect described herein as "exemplary" is not necessarily to be construed as preferred or advantageous over other aspects.

A communication device may include both transmit (Tx) and receive (Rx) MIMO capability. For example, a 5G New Radio (NR) communication device may support multiple transmitters, multiple receivers and be capable of communication on multiple communication bands. In some examples, the communication device may also include carrier aggregation (CA) where it may simultaneously communicate on multiple communication bands. A 5G NR communication device may also support the transmission of a sounding reference signal (SRS) where a broadcast signal may be sent over all antennas on the communication device in a short period of time. Such communication may also support antenna switch diversity (ASDIV), where a communication signal may be routed from one circuit or module (for example, a radio frequency integrated circuit (RFIC)) to another circuit or module (for example, one or more front end modules (FEMs)) having one or more antennas. Similarly, a receive (Rx) MIMO capability may include a receive signal being routed from an antenna on one FEM to one or more RFICs. Such configurations may be referred to as higher order MIMO architectures and may include multiple transmitters and multiple receivers.

As noted, a wireless device may support carrier aggregation. In general, carrier aggregation involves simultaneous operation on multiple carriers. Filtering requirements when implementing carrier aggregation increase as the number of combinations of bands a device is required to support simultaneously increases. For example, when multiple bands are being used amongst different modes (e.g., different pairs of bands), the matching and loading of different connected filter impacts device performance. For interband carrier aggregation, if the bands are close to each other in frequency, the complexity of the filtering requirements increases.

Quadplexers are used to support two frequency division duplex communication bands as part of carrier aggregation support. In such operation, support for six communication bands would use four filter components (e.g., where each filter component may include multiple filters).

In some aspects, radio frequency (RF) architecture can be simplified by configuring the single component multiband multiplexer to use a combination of certain frequency bands defined by different cellular communication standards (e.g., third generation partnership project (3GPP) frequency bands, such as 3G/4G/5G frequency bands). In some cases, configuring the single component multiband multiplexer to use such a combination of frequency bands can reduce the number of switches used to connect bands to power amplifiers and low noise amplifiers. Additionally or alternatively, in some cases, configuring the single component multiband multiplexer to use such a combination of frequency bands can simplify routing between various components through use of a single filtering component in place of multiple filtering components in previous systems. Such simplification can result in improved RF performance, as well as lower device complexity, smaller space usage, and corresponding reductions in device cost and/or size.

The present disclosure relates to a radio frequency, RF, front end module. The radio frequency front end module comprises a common antenna node, an antenna switch matrix, ASM, comprising an ASM first signal terminal and at least two ASM second signal terminals, the ASM first signal terminal being coupled with the common antenna node; at least two RF micro acoustic filters coupleable to the common antenna node via the ASM. At least a first RF micro acoustic filter of the at least two RF micro acoustic filters comprises a micro acoustic pre-filter comprising a pre-filter first signal terminal and a pre-filter second signal terminal, the pre-filter first signal terminal coupled with the ASM; and a micro acoustic main-filter comprising a main-filter first signal terminal and a main-filter second signal terminal. The micro acoustic pre-filter and the micro acoustic main-filter being separated by a signal line coupling the pre-filter second signal terminal to the main-filter first signal terminal, the micro acoustic pre-filter being on a different die than the micro acoustic main-filter and being coupled by the signal line.

In some cases, one or more module filters are connected to a common antenna node only by a long signal line due to the physically possible filter placement in the module. This long signal line introduces a phase shift, which must be compensated to provide an open phase to the other filters. The phase compensation comes along with additional losses.

Splitting the RF micro acoustic filter into a micro acoustic pre-filter and a micro acoustic main-filter provides the flexibility of placing the micro acoustic pre-filter close to a common node, or close to the common antenna node, thus avoiding the negative impact of long signal lines, e.g., reducing the insertion loss, respectively the loading effect on other filters (or other elements) connected to the common node. A shorter line length in front of the pre-filter reduces the input capacitance of the filter and thus allows the matching with a larger input matching coil (shunt coil for multiplexing). Larger shunt coil and smaller filter input capacitance leads to a reduced phase slope with respect to the frequency seen by any other filter coupled to the common node. A reduced phase slope in general leads to better performance (lower insertion loss and better matching) to the other bands, respectively filters, connected to the common node. A larger shunt coil provides lower matching losses by its Q-factor itself and by its smaller rotation in the smith-chart. The pre-filter concept allows to use a shorter line length in front of the pre-filter and, as mentioned above, a higher Q-material only where needed to obtain the better Out-of-band gamma, avoiding the full-blown cost of all full filters in high Q-material.

Further details regarding the aspects provided herein are described with respect to the figures.

FIG. 1 shows a wireless device 110 communicating with a wireless communication system 120. The wireless communication system 120 may be a long term evolution (LTE) system, a 5th generation wireless system (5G), a 5G NR (new radio) system, a code division multiple access (CDMA) system, a global system for mobile communications (GSM) system, a wireless local area network (WLAN) system, or some other wireless system, or combination thereof. A CDMA system may implement wideband CDMA (WCDMA), time division synchronous CDMA (TD-SCDMA), CDMA2000, or some other version of CDMA. For simplicity, FIG. 1 shows the wireless communication system 120 including two base stations 130 and 132 and one system controller 140. In general, a wireless system may include any number of base stations and any number of network entities. As described herein, LTE systems utilize numbered communication bands, such as bands 1, 3, 4, 23, 65, and 66 with associated frequency ranges that are used for communications as described herein.

The wireless device 110 may also be referred to as a user equipment (UE), a mobile station, a terminal, an access terminal, a subscriber unit, a station, etc. The wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, and the like. The wireless device 110 may be capable of communicating with the wireless communication system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups—e.g., within a certain frequency range), with each band group including a number of frequency bands (or simply, "bands"). For example, in some systems each band may cover up to 200 MHz and may include one or more carriers. For example, each carrier may cover up to 40 MHz in LTE. In other aspects, other frequency ranges may be used. Examples of LTE/UMTS bands are listed in 3GPP TS 36.101. The wireless device 110 may be configured with multiple carriers in several bands (e.g., see LTE Release 15).

In general, carrier aggregation (CA) may be categorized into two types: intra-band CA and inter-band CA. Intra-band CA refers to operation on multiple carriers within the same band and inter-band CA refers to operation on multiple carriers in different bands.

Figure 2:
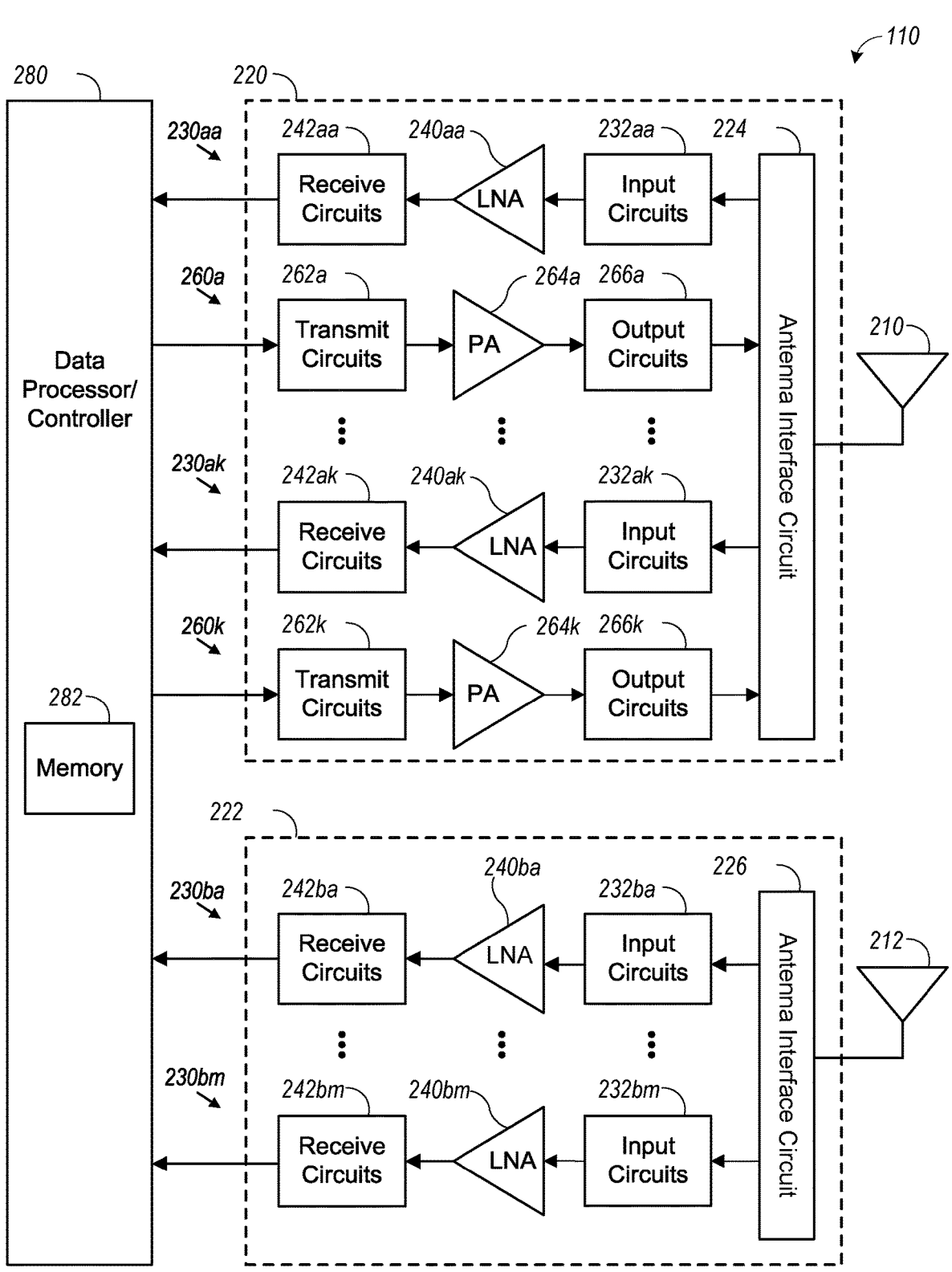
FIG. 2 is a functional block diagram of the wireless device of FIG. 1 according to an aspect of the present disclosure.

FIG. 2 is a functional block diagram of the wireless device 110 of FIG. 1 according to an aspect of the present disclosure. In some aspects, the wireless device 110 includes a transceiver 220 coupled to a primary antenna 210, receivers 222 coupled to a secondary antenna 212, and a data processor/controller 280. The transceiver 220 includes multiple (K) receivers 230aa to 230ak and multiple (K) transmitters 260a to 260k to support multiple bands, carrier aggregation, multiple radio technologies, etc. The receivers 222 include multiple (M) receivers 230ba to 230bm to support multiple bands, carrier aggregation, multiple radio technologies, receive diversity, MIMO transmission from multiple transmit antennas to multiple receive antennas, etc.

In the aspects illustrated by FIG. 2, each receiver 230 includes input circuits 232, a low-noise amplifier (LNA) 240, and receive circuits 242. For data reception, the antenna 210 receives signals from base stations and/or other transmitter stations and provides a received RF signal, which is routed through an antenna interface circuit 224 and provided to a selected receiver. The antenna interface circuit 224 may include switches, duplexers, transmit filters, receive filters, etc. The description below assumes that the receiver 230*aa* is the selected receiver. Within the receiver 230*aa*, the received RF signal is passed through input circuits 232*aa*, which provides an input RF signal to an LNA 240*aa*. Input circuits 232*aa* may include a matching circuit, a receive filter, etc. The LNA 240*aa* amplifies the input RF signal and provides an output RF signal. Receive circuits 242*aa* amplify, filter, and down convert the output RF signal from RF to baseband and provide an analog input signal to data processor 280. Receive circuits 242 may include mixers, filters, amplifiers, matching circuits, an oscillator, a local oscillator (LO) generator, a phase locked loop (PLL), etc. Each remaining receiver 230 in the transceiver 220 and each receiver 230 in the receivers 222 may operate in a similar manner as the receiver 230*aa* in the transceiver 220.

In the aspects illustrated in FIG. 2, each transmitter 260 includes a transmit circuit (transmit circuit 262*a* through 262*k*), a power amplifier (PA) (a PA 264*a* through 264*k*), and an output circuit (output circuits 266*a* through 266*k*). For data transmission, a data processor 280 processes (e.g., encodes and modulates) data to be transmitted and provides an analog output signal to a selected transmitter. The description below assumes that the transmitter 260*a* is the selected transmitter. Within the transmitter 260*a*, transmit circuits 262*a* amplify, filter, and upconvert the analog output signal from baseband to RF and provide a modulated RF signal. Transmit circuits 262*a* may include amplifiers, filters, mixers, matching circuits, an oscillator, an LO generator, a PLL, etc. A PA 264*a* receives and amplifies the modulated RF signal and provides a transmit RF signal having the proper output power level. The transmit RF signal is passed through output circuits 266*a*, routed through the antenna interface circuit 224, and transmitted via the antenna 210. Output circuits 266*a* may include a matching circuit, a transmit filter, a directional coupler, etc.

FIG. 2 shows aspects of a device including receivers 230 and transmitters 260. A receiver and a transmitter may also include other circuits not shown in FIG. 2, such as filters, matching circuits, etc. All or a portion of the transceiver 220 and receivers 222 may be implemented on one or more analog integrated circuits (ICs), RF ICs (RFICs), mixed-signal ICs, etc. For example, LNAs 240, receive circuits 242, and transmit circuits 262*a* through 262*k* may be implemented on one module, which may be an RFIC, etc. Antenna interface circuits 224 and 226, input circuits 232, output circuits 266, and PAs 264*a* through 264*k* may be implemented on another module, which may be a hybrid module, etc. The circuits in the transceiver 220 and receivers 222 may also be implemented in other manners.

The data processor/controller 280 may perform various functions for the wireless device 110. For example, the data processor 280 may perform processing for data received via the receivers 230 and data transmitted via the transmitters 260. The controller 280 may control the operation of antenna interface circuits 224 and 226, input circuits 232, LNAs 240, receive circuits 242, transmit circuits 262*a* through 262*k*, PAs 264*a* through 264*k*, output circuits 266, or a combination thereof. A memory 282 may store program codes and data for the data processor/controller 280. The data processor/controller 280 may be implemented on one or more application specific integrated circuits (ASICs) and/or other ICs.

The wireless device 110 may receive transmissions from one or more base stations/cells on multiple carriers at different frequencies for carrier aggregation. For intra-band carrier aggregation (CA), the transmissions are sent on different carriers in the same band. For inter-band CA, the transmissions are sent on multiple carriers in different bands.

FIG. 3A shows an example of contiguous intra-band CA. In the example shown in FIG. 3A, a wireless device (e.g., the wireless device 110) is configured with four contiguous carriers in the same frequency range, which is a band in mid-band frequency range. The wireless device may send and/or receive transmissions on multiple contiguous carriers within the same defined frequency range.

FIG. 3B shows an example of non-contiguous intra-band CA. In the example shown in FIG. 3B, a wireless device (e.g., the wireless device 110) is configured with four non-contiguous carriers in the same frequency range, which is a band in the mid-band frequency range. The carriers may be separated by 5 MHz, 10 MHz, or some other amount. The wireless device may send and/or receive transmissions on multiple non-contiguous carriers within the same frequency range (e.g., mid-band).

FIG. 3C shows an example of inter-band CA in the same frequency range. In the example shown in FIG. 3C, a wireless device (e.g., the wireless device 110) is configured with four carriers in two bands in the same frequency range, which is the mid-band frequency range. The wireless device may send and/or receive transmissions on multiple carriers in different bands in the same frequency range (e.g., Mid-Band 1 (MB1) and Mid-Band 2 (MB2) in FIG. 3C).

FIG. 3D shows an example of inter-band CA in different frequency ranges. In the example shown in FIG. 3D, a wireless device (e.g., the wireless device 110) is configured with four carriers in two bands in different frequency ranges, which include two carriers in one band in the low-band frequency range and two additional carriers in another band in the mid-band frequency range. The wireless device may send and/or receive transmissions on multiple carriers in different bands in different frequency ranges (e.g., low-band frequency ranges and mid-band frequency ranges in FIG. 3D). FIGS. 3A to 3D show four examples of carrier aggregation. Carrier aggregation may also be supported for other combinations of bands. For example, carrier aggregation may be supported for low-band and high-band, mid-band and high-band, high-band and high-band, and other combinations with ultra-high band frequency ranges and long-term evolution in unlicensed spectrum (LTE-U).

Figure 4A:
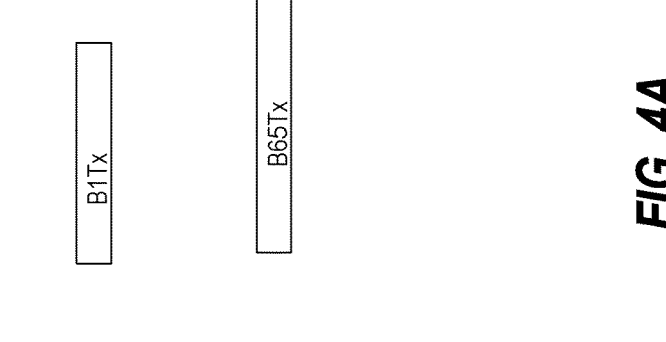
FIG. 4A is a diagram illustrating band combinations for a carrier aggregation scenario according to aspects of the present disclosure.

FIG. 4A is a diagram 400 illustrating band combinations supported by a single RF filter component in accordance with some aspects. Diagram 400 shows approximate frequency ranges for six bands (e.g., 1/3/4/23/65/66) in accordance with 3GPP communication standards. As illustrated, the six different bands each include either a transmission (Tx) or receive (Rx) frequency component that overlaps partially with a frequency component from one of the other six bands. For example, the Tx frequency range for band 3 overlaps with the Tx frequency ranges for bands 66 and 4. Additionally, the illustrated frequency bands can be grouped into four ranges with gaps between the ranges, such that four filter bands for a quadplexer can provide filtering for the various communication band frequency ranges.

For example, different geographic regions support different combinations of carrier aggregation (CA) modes and associated bands. This can present a challenge in managing network handovers and roaming amongst the different geographic regions. For instance, a wireless device that is configured to utilize bands specific to the U.S. and that is roaming into Europe may not support the necessary frequencies nor the correct combination of frequencies for CA. In another example, the U.S. band-specific wireless device may support the necessary European frequency bands but not the correct combinations necessary for CA in Europe. According to aspects described herein, a wireless device can use an individual RF component (e.g., a single RF component) to support the different combinations of bands for different CA modes (e.g., a multiband multiplexer in a configuration that allows for supporting the different combinations of bands). For example, a single RF component (e.g., the multiband multiplexer) of the wireless device that supports different CA modes and associated frequency bands for different geographic regions can be used to operate using a particular CA mode and associated frequency band(s) when the wireless device is located in a given geographic region. In such an example, the wireless device can function in different geographic regions using the single RF component supporting the different CA modes and associated frequency bands, rather than requiring the wireless device to include additional RF elements for supporting different combinations of CA modes and associated bands for different geographic regions.

The diagram 400 of FIG. 4A illustrates inter-band carrier aggregation scenarios where two frequency division duplex (FDD) bands are used simultaneously for reception or transmission or both to increase data rates. The illustrated six communication bands include Tx and Rx frequency ranges as follows: B3 TX 1710-1785 megahertz (MHz); B3 RX 1805-1880 MHz; B1 Tx 1920-1980 MHz; B1 Rx 2110-2170 MHz; B4 Tx 1710-1755 MHz; B4 Rx 2110-2155 MHz; B66 Tx 1710-1780 MHz; B66 Rx 2110-2200 MHz; B23 Tx 2000-2020 MHz; B23 Rx 2180-2200 MHz; B65 Tx 1920-2010 MHz; and B65 Rx 2110-2200 MHz. While a specific group of six frequency bands is described, it will be apparent that other bands can be used in accordance with other aspects, so long as the groupings of the frequency ranges for the different communication bands overlap in a similar fashion to the overlap described above, and include a gap between frequency groupings sufficient to allow filter stopbands between the groups.

Figure 4B:
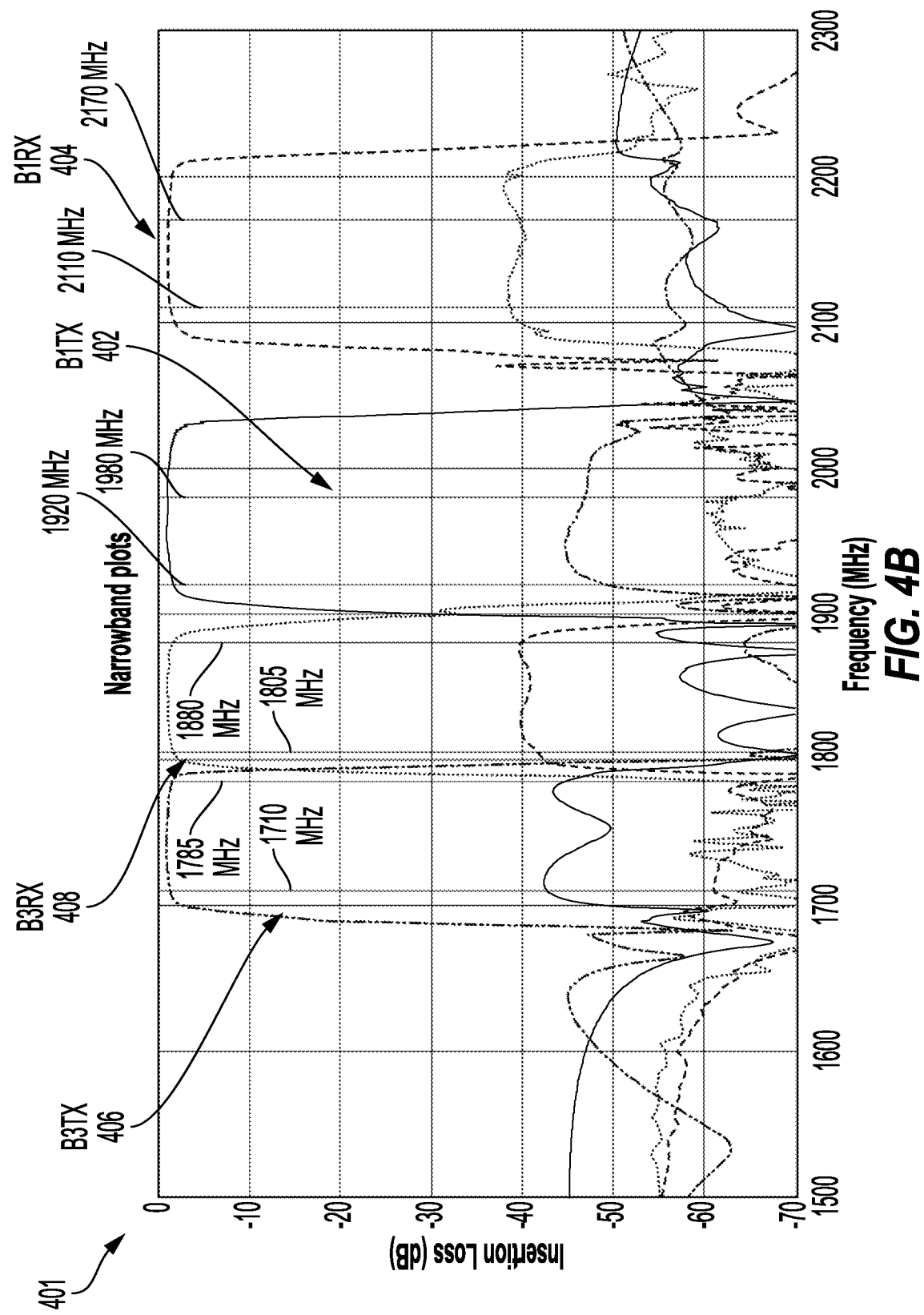
FIG. 4B is a chart of a multiband multiplexer insertion loss frequency response shown with an associated communication band for implementation with carrier aggregation according to aspects of the present disclosure.
Figure 4C:
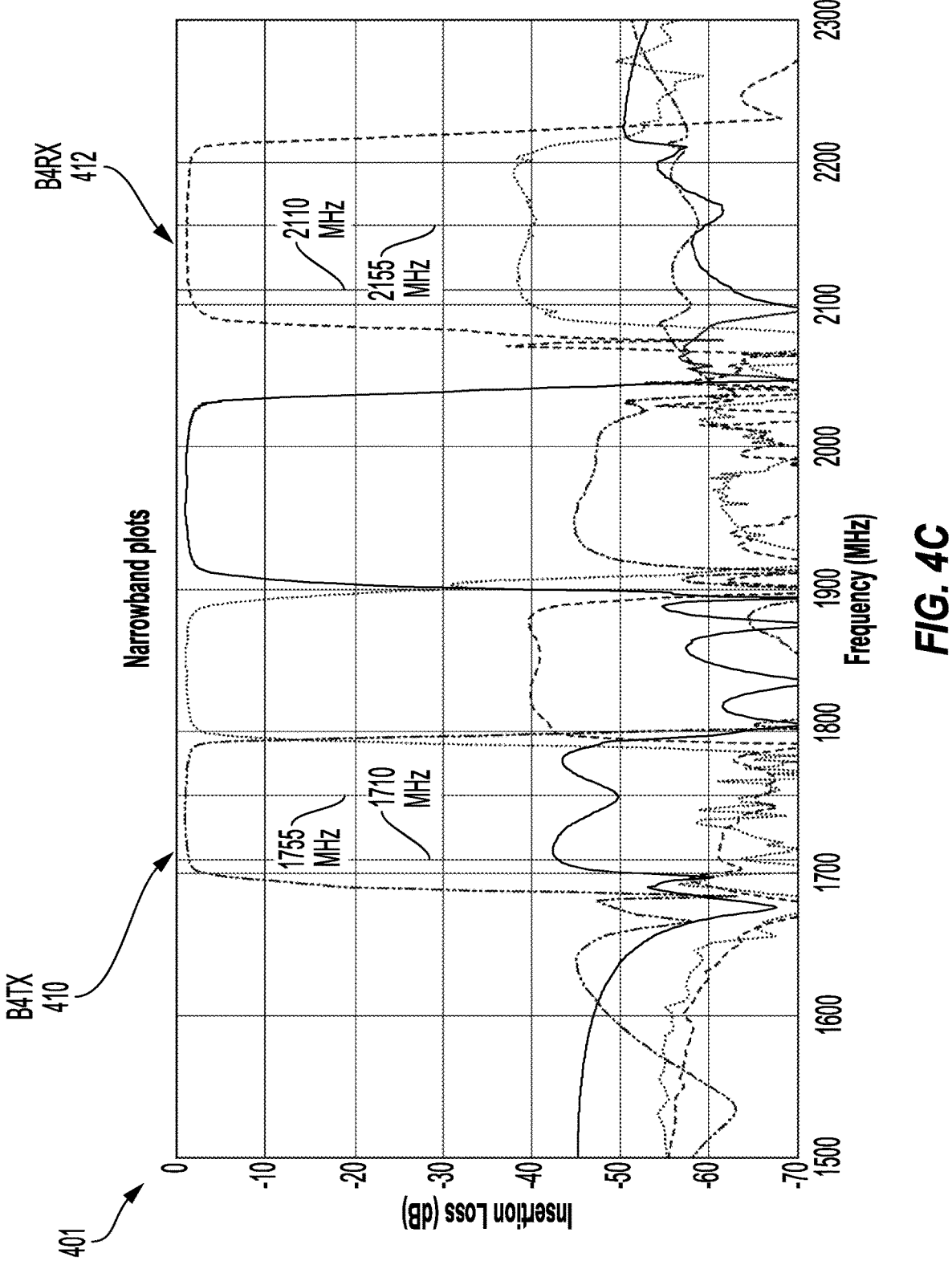
FIG. 4C is a chart of a multiband multiplexer insertion loss frequency response shown with an associated communication band for implementation with carrier aggregation according to aspects of the present disclosure.
Figure 4D:
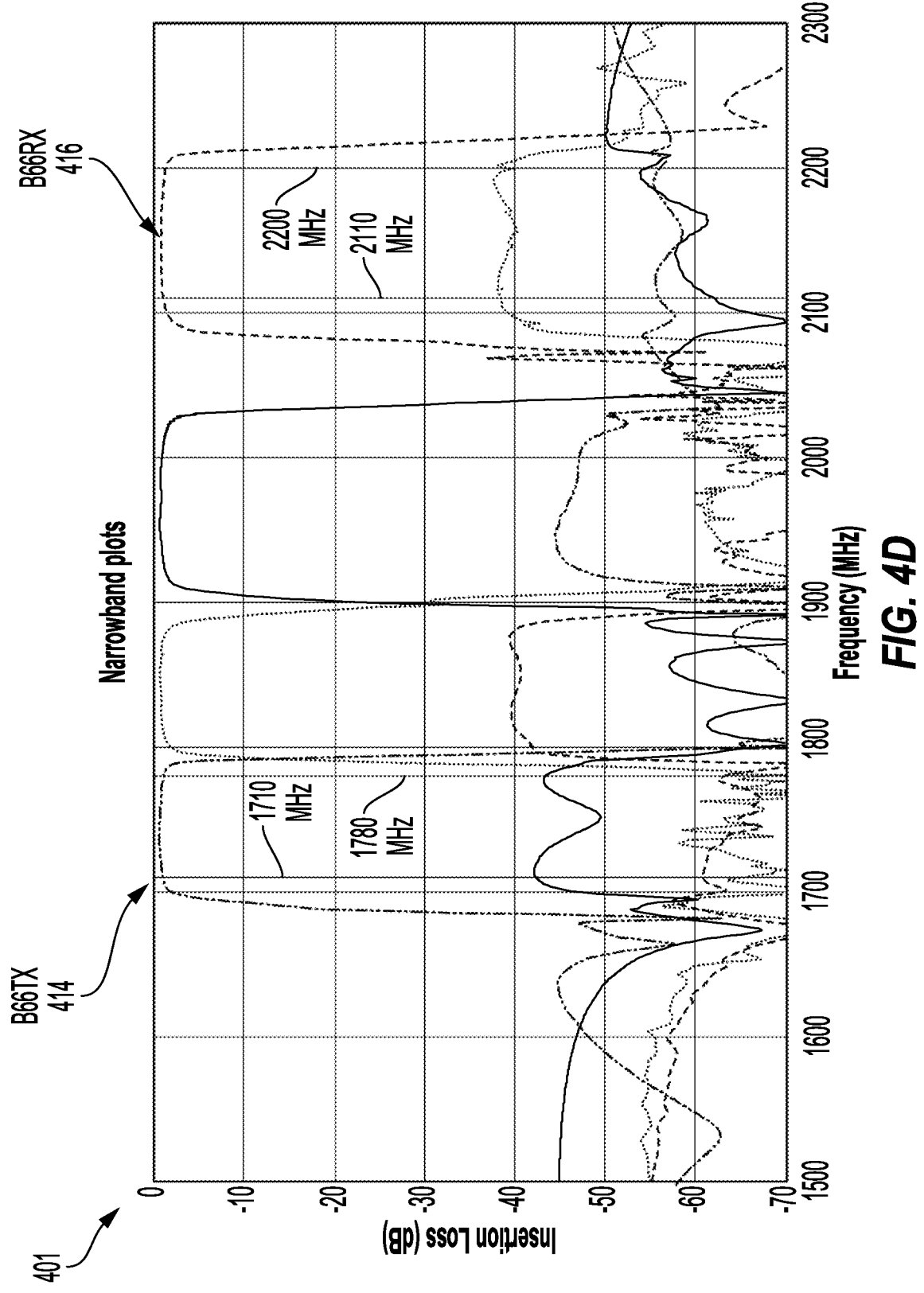
FIG. 4D is a chart of a multiband multiplexer insertion loss frequency response shown with an associated communication band for implementation with carrier aggregation according to aspects of the present disclosure.
Figure 4E:
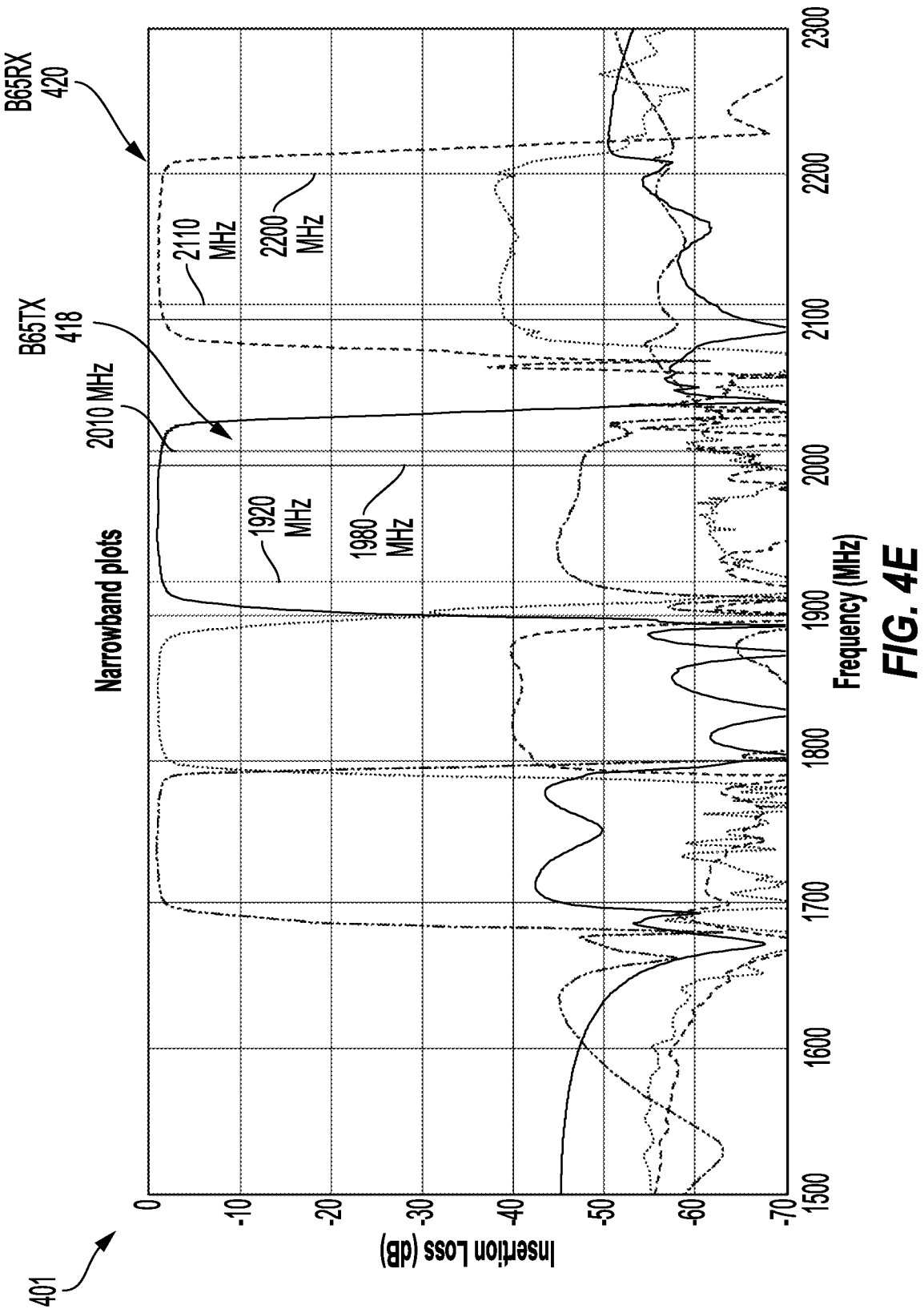
FIG. 4E is a chart of a multiband multiplexer insertion loss frequency response shown with an associated communication band for implementation with carrier aggregation according to aspects of the present disclosure.
Figure 4F:
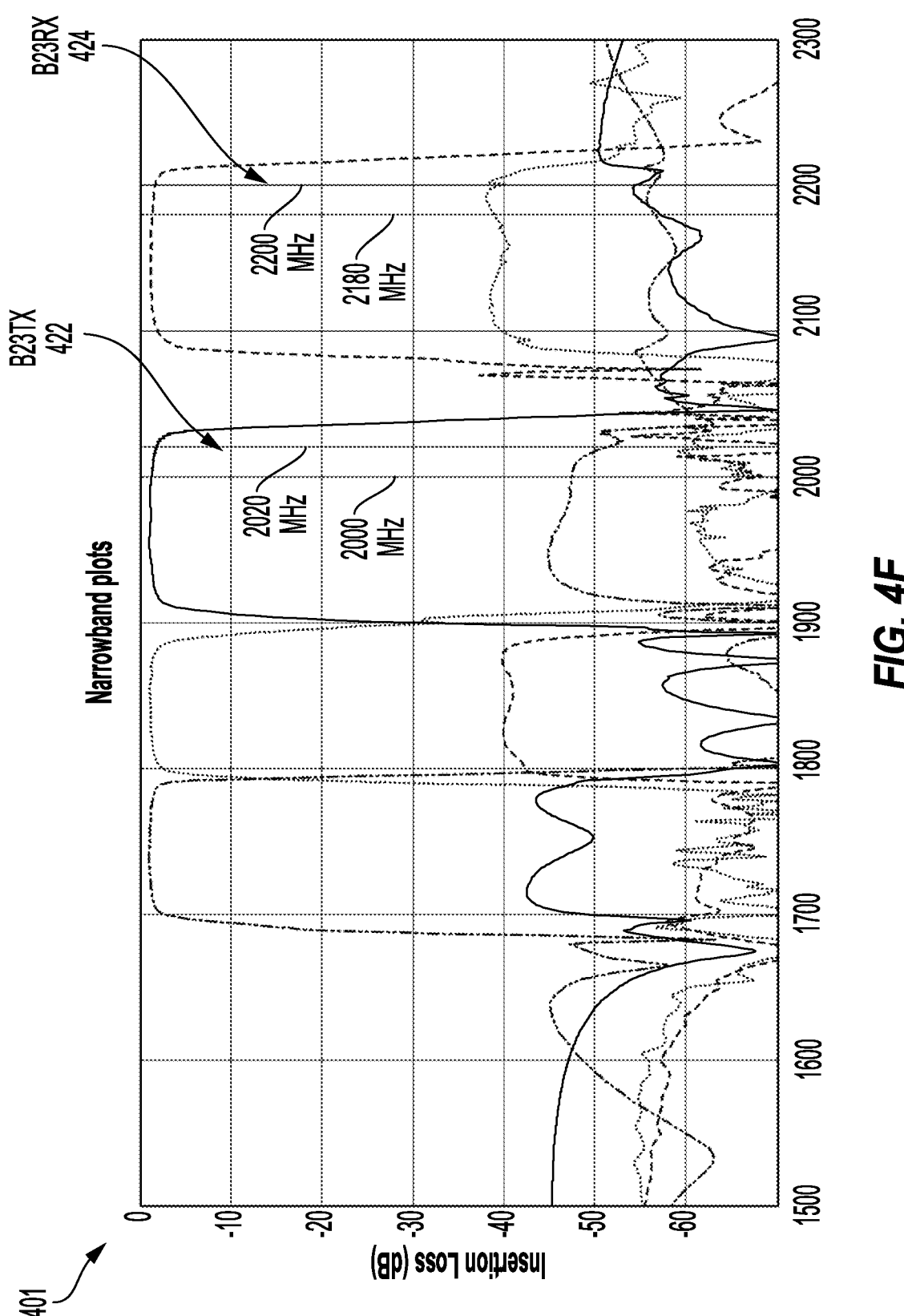
FIG. 4F is a chart of a multiband multiplexer insertion loss frequency response shown with an associated communication band for implementation with carrier aggregation according to aspects of the present disclosure.

FIGS. 4B-F illustrate a frequency response 401 for a single RF component that can filter six bands using four filter passbands. Each of the FIGS. 4B-F shows different communication bands overlaid on the filter frequency response 401 chart. FIG. 4B shows the band 1 TX range 402, the band 1 Rx range 404, the band 3 Tx range 406, and the band 3 Rx range 408. FIG. 4C shows the band 4 Tx range 410 and the band 4 Rx range 412. FIG. 4D shows the band 66 Tx range 414 and the band 66 Rx range 416. FIG. 4E shows the band 65 Tx range 418 and the band 65 Rx range 420. FIG. 4F shows the band 23 Tx range 422 and the band 23 Rx range 424 for a carrier aggregation scenario according to aspects of the present disclosure.

Figure 4G:
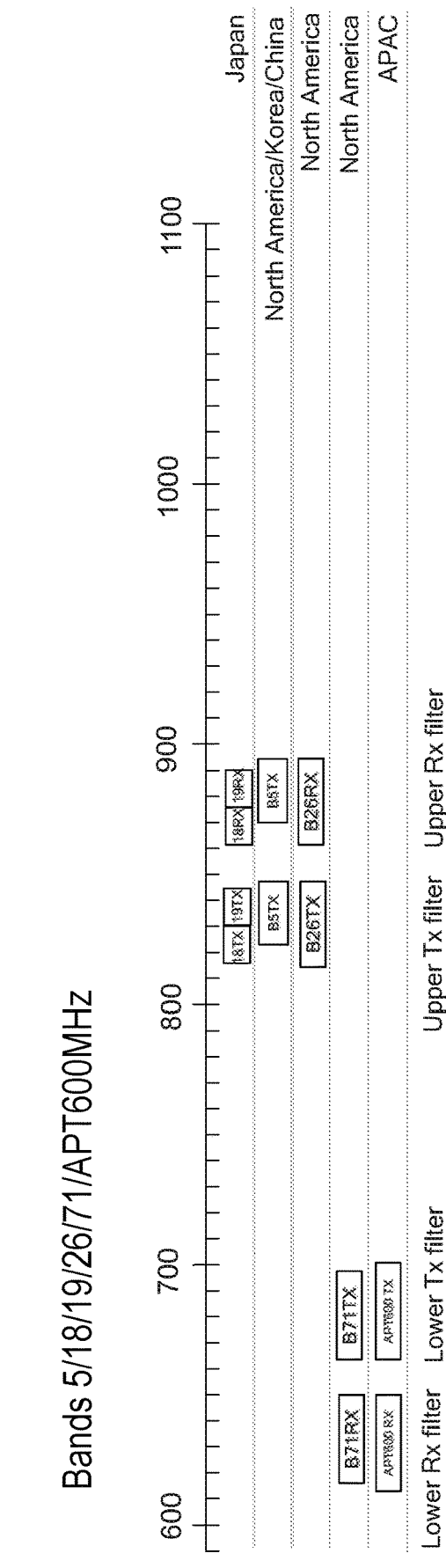
FIG. 4G is a diagram illustrating band combinations for a carrier aggregation scenario according to aspects of the present disclosure.

FIG. 4G is a diagram 492 illustrating band combinations for a carrier aggregation scenario according to aspects of the present disclosure. The above descriptions of FIGS. 4A-F describe a particular support for a grouping of bands by a multiband multiplexer. Additional designs can use similar structures with an RF component for a plurality of overlapping communication bands, in addition to the bands described above for FIGS. 4A-F. FIG. 4G describes LTE defined bands 5, 26, 71, and a new APT 600 MHz band. Table 1 below illustrates details of such bands along with associated frequency ranges in MHz.

TABLE 1

| Frequency Band | Frequency Range (MHz) | | Geographical area |
|---|---|---|---|
| | TX | RX | |
| 5 | 824-849 | 869-894 | North America/China |
| 18 | 815-830 | 860-875 | Japan |
| 19 | 830-845 | 875-890 | |
| 26 | 814-849 | 859-894 | North America |
| 71 | 663-698 | 617-652 | North America |
| APT 600 MHz | 663-703 | 612-652 | Asia Pacific |

FIG. 4H is a diagram illustrating band combinations 494 for a carrier aggregation scenario according to aspects of the present disclosure. Just as above for FIG. 4G, FIG. 4H shows an alternate band combination, including LTE defined bands LTE defined bands 29, 67, and 71 combined with a new APT 600 MHz band. Table 2 below illustrates details of such bands along with associated frequency ranges in MHz.

TABLE 2

| Frequency Band | Frequency Range (MHz) | | Geographical area |
|---|---|---|---|
| | TX | RX | |
| 29 | — | 717-728 | North America |
| 67 | — | 738-758 | Europe |
| 71 | 663-698 | 617-652 | North America |
| APT 600 MHz | 663-703 | 612-652 | Asia Pacific |

While band combinations in diagrams 400 and 492 illustrate support for six bands that can be managed by a multiband multiplexer with four passbands (e.g., a quadplexer), it will be apparent that other configurations with other numbers of passbands can be used in accordance with examples described herein. Band combinations 494 includes passbands for four communication bands that can be handled by a single RF element structured as a triplexer to handle the illustrated overlapping frequencies of the illustrated communication bands. Additional aspects can include any number of passbands in a single element multiband multiplexer for bands with overlapping frequency ranges such that filter elements (e.g., using acoustoelectric resonators) can provide sufficient performance for the frequency ranges including the overlapping ranges of the communication bands supported by the RF element.

FIG. 5A is a schematic diagram of an example of a portion of a front-end circuit 500 of a transceiver circuit of the wireless device 110 of FIG. 2 including a multiband multiplexer. FIG. 5B is a schematic diagram illustrating the portion of the front-end circuit 500 from FIG. 5A, with amplifiers 505, 506, and 507 connected to filter component 501. As illustrated in FIG. 5A and FIG. 5B, aspects of the multiband multiplexer include a filter component 501 integrated into a communication path via switch 503 to support carrier aggregation of several communication bands. In some aspects, additional components can be connected to switch inputs 502 to support additional communication bands (not shown). The multiband multiplexer is configured so that communications on any band in the system can be communicatively coupled to an antenna via switch 503. In some modes (e.g., certain carrier aggregation modes where multiple bands are active simultaneously), multiple inputs may be simultaneously connected to an antenna connection port when switch 503 is implemented as a switch network (e.g., multiple switches may be closed at the same time).

Figure 6:
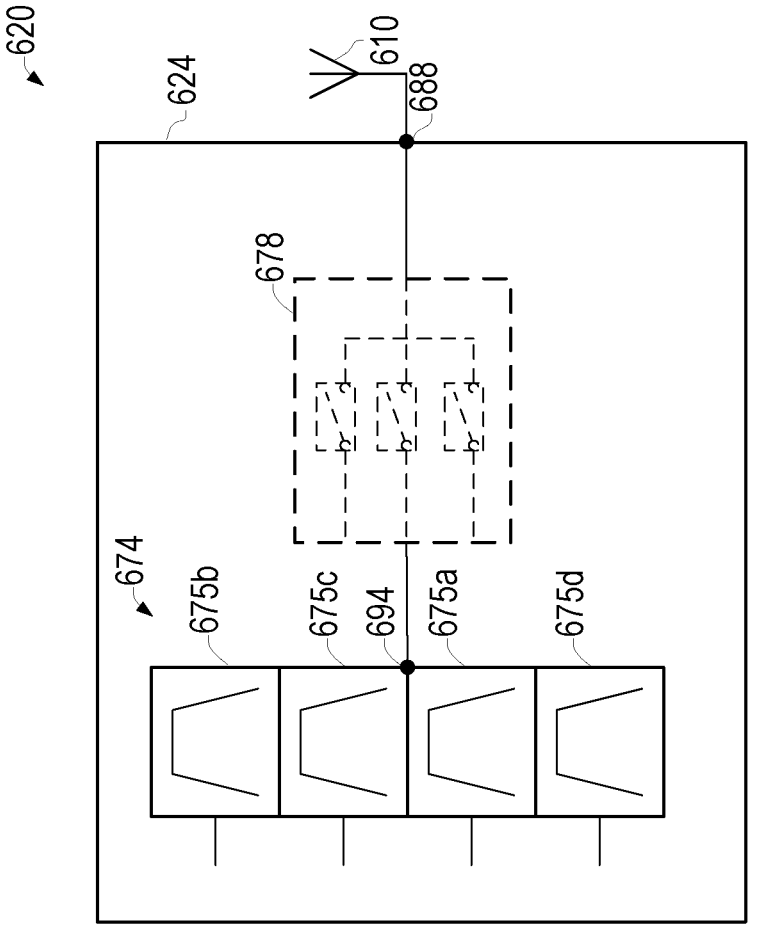
FIG. 6 is a schematic diagram of aspects of a multiband multiplexer according to aspects of the present disclosure.

FIG. 6 is a schematic diagram of an example of a portion of a plurality of filter circuits 674 within a front-end circuit 624 of a transceiver circuit 620 of the wireless device 110 of FIG. 2 according to aspects of the present disclosure. In one illustrative example, the plurality of filter circuits 674 may form a quadplexer (e.g., similar to the single filter component 501) and may be connected to a common port 694. The plurality of filter circuits 674 is configured to filter one or more signals transmitted and received over multiple predefined communication bands.

In accordance with aspects described herein, the plurality of filter circuits 674 (e.g., including filter elements 675a, 675b, 675c, and 675d) can be implemented as a single component within a wireless communication device, with associated size, cost, and performance benefits described above. In some aspects, each of the filter elements of filter circuit 674 can be associated with a different passband illustrated in FIGS. 4B through 4F. For example, in some aspects, the plurality of filter circuits 674 can be configured to implement a first passband for filter element 675a between 1920 MHz and 2020 MHz, a second passband for filter element 675b between 1710 MHz and 1785 MHz, a third passband for filter element 675c between 2110 MHz and 2200 MHz, and a fourth passband for filter element 675d between 1800 MHz and 1880 MHz. These passbands correspond to the illustrated passbands shown in FIGS. 4B through 4F. In other implementations, different numbers of filter elements can be used, and different passbands can be used (e.g., passbands corresponding to coverage of the different overlapping or non-overlapping band frequencies).

In the example of FIG. 6, the plurality of filter circuits 674 includes a first filter element 675a configured to have a first passband. In one illustrative example, the first filter element 675a is configured as a transmit path filter (e.g., transmit filter). In some aspects, the second transmission frequency range may be partially overlapping with the first transmission frequency range (and having at least some portion extending beyond a definition of the first transmission frequency rage of the second predefined communication band). In some examples, a receive filter covers Rx frequency ranges for multiple overlapping or non-overlapping communication bands.

While not shown in FIG. 6, the transceiver circuit 620 further includes a power amplifier and a connection port 688 configured to electrically connect to an antenna 610. In this case at least one of the plurality of filter circuits 674 is selectively electrically connected between the power amplifier and the connection port 688 (there may be intervening circuit elements between either the power amplifier and the plurality of filter circuits 674 or the antenna 610).

Furthermore, the front-end circuit 624 may include one or more electronic switching components 678 electrically connected between the plurality of filter circuits 674 and the connection port 688 configured to electrically connect to an antenna 610. Connections to other inputs of the electronic switching components 678 are not shown in FIG. 6 but are there to show that there may be other filter circuits selectively connected to the connection port 688. As such, in certain implementations there may optionally be a switch between the output of the plurality of filter circuits 674 and the connection port 688 to selectively connect the plurality of filter circuits 674 to the connection port 688 and on to antenna 610. The electronic switching component 678 are shown optional in FIG. 6 to illustrate that the plurality of filter circuits 674 may be provided in various implementations or in a module which connects to an antenna interface without including other filters.

In certain aspects, the transceiver circuit 620 may include one or more other filter circuits and a plurality of switching components where the plurality of switching components are electrically connected between a node and both the plurality of filter circuits and the one or more other filter circuits. In certain aspects, the transceiver circuit 620 includes a diplexer electrically connected between an antenna 610 and the plurality of filter circuits 674. In an aspect, the plurality of filter circuits comprises one or more acoustic wave resonators for example such as at least one of a surface acoustic wave component or a bulk acoustic wave component.

Figure 7:
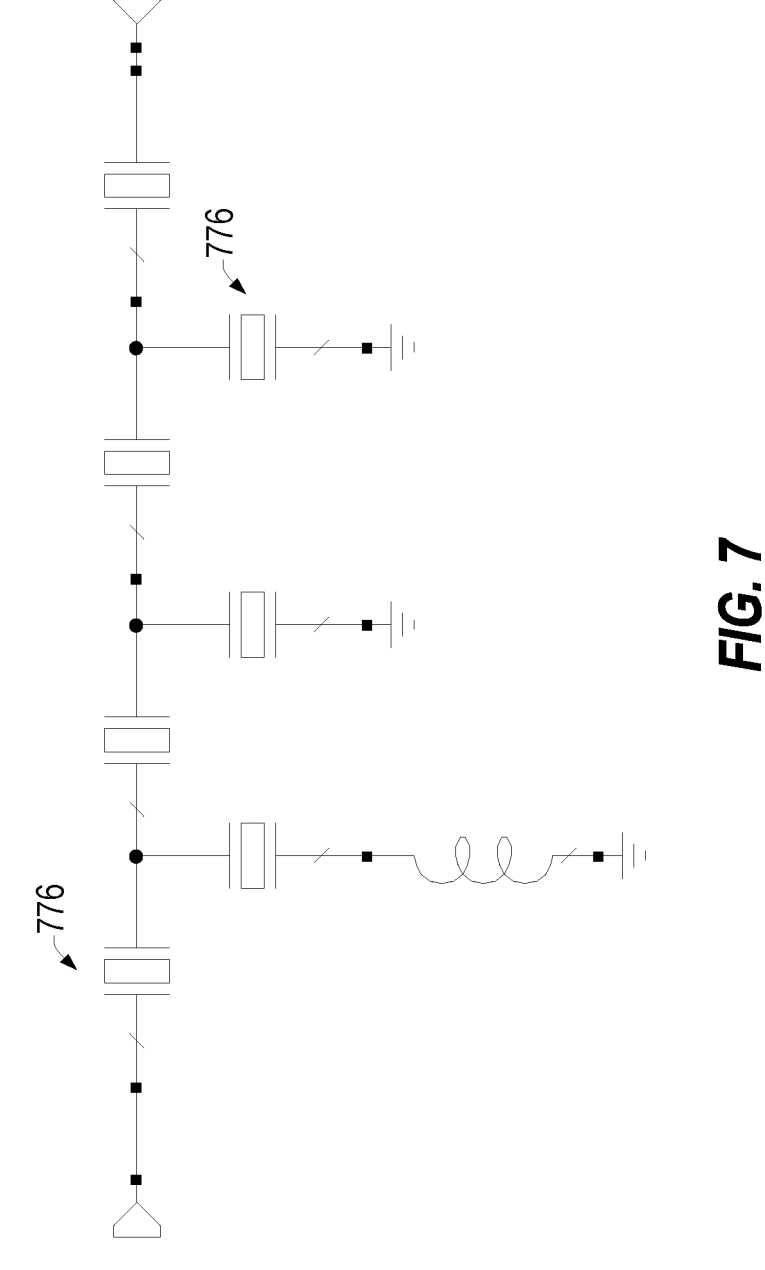
FIG. 7 is a schematic diagram of an example of an implementation of a filter element that may correspond to one of the filter elements of FIG. 6 in accordance with some aspects.

FIG. 7 is a schematic diagram of an example of an implementation of a filter element 775c that may correspond to any of the filter elements 675a-d of FIG. 6 to implement passbands. FIG. 7 provides one example of a topology that may be used for the filter element 675c of FIG. 6. Similar topologies may be used to form the other filter elements described herein according to the passbands described above. The filter element 775c includes a ladder network topology that may be surface acoustic wave (SAW) resonators or bulk acoustic wave (BAW) resonators 776 (or other resonant structures) connected in both series and shunt configurations (and may include one or more inductors or capacitors). Based on the selected resonator dimensions, thickness, materials, and other characteristics of the resonators the desired passband may be achieved according to the topology shown. The configuration shown in FIG. 7 illustrates electroacoustic resonators (or that may include hybrid LC acoustic resonators, cavity type resonators, or other types of resonators) to provide for a passband that spans the desired frequency range. As described herein, SAW, BAW, and other devices can be referred to as resonators or electroacoustic resonators. Aspects of the present disclosure are directed to RF filters for filtering a signal for a particular frequency or range of frequencies, particularly in a multiband context, where multiple filters can be used to send signals to a shared antenna. Aspects of the present disclosure use resonant structures added to RF filters to achieve filter performance for the described multiband multiplexers.

Figures 8A, 8B:
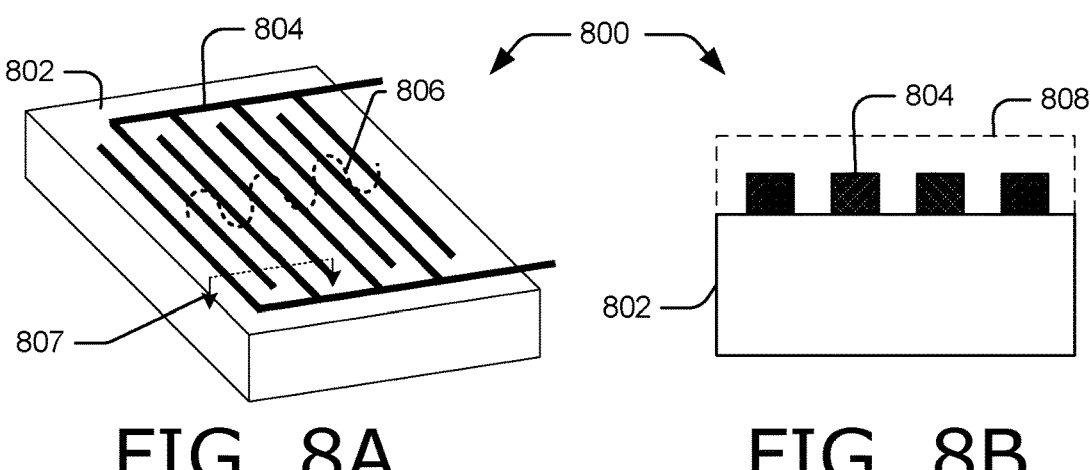
FIG. 8A is a diagram of a perspective view of an example of an electroacoustic device for use with some examples described herein.
FIG. 8B is a diagram of a side view of the electroacoustic device of FIG. 8A.

FIG. 8A is a diagram of a perspective view of an example of an electroacoustic device 800. The electroacoustic device 800 may be configured as or be a portion of a SAW resonator. In certain descriptions herein, the electroacoustic device 800 may be referred to as a SAW resonator. However, there may be other electroacoustic device types (e.g., BAW or TFBAR) that may be constructed based on the principles similar to those described herein. The electroacoustic device 800 includes an electrode structure 804, that may be referred to as an interdigital transducer (IDT), on the surface of a piezoelectric material 802. The electrode structure 804 generally includes first and second comb shaped electrode structures (conductive and generally metallic) with electrode fingers extending from two busbars towards each other arranged in an interlocking manner in between two busbars (e.g., arranged in an interdigitated manner). An electrical signal excited in the electrode structure 804 (e.g., applying an AC voltage) is transformed into an acoustic wave 806 that propagates in a particular direction via the piezoelectric material 802. The acoustic wave 806 is transformed back into an electrical signal and provided as an output. In many applications, the piezoelectric material 802 has a particular crystal orientation such that when the electrode structure 804 is arranged relative to the crystal orientation of the piezoelectric material 802, the acoustic wave mainly propagates in a direction perpendicular to the direction of the fingers (e.g., parallel to the busbars).

FIG. 8B is a diagram of a side view of the electroacoustic device 800 of FIG. 8A along a cross-section 807 shown in FIG. 8A. The electroacoustic device 800 is illustrated by a simplified layer stack including a piezoelectric material 802 with an electrode structure 804 disposed on the piezoelectric material 802. The electrode structure 804 is conductive and generally formed from metallic materials. The piezoelectric material may be formed from a variety of materials such as quartz, lithium tantalate (LiTaO3), lithium niobite (LiNbO3), doped variants of these, or other piezoelectric materials. It should be appreciated that more complicated layer stacks (e.g., 4 stacks, 6 stacks, etc.) including layers of various materials may be possible within the stack. For example, optionally, a temperature compensation layer 808 denoted by the dashed lines may be disposed above the electrode structure 804. The piezoelectric material 802 may be extended with multiple interconnected electrode structures disposed thereon to form a multi-resonator filter or to provide multiple filters. While not illustrated, when provided as an integrated circuit component, a cap layer may be provided over the electrode structure 804. The cap layer is applied so that a cavity is formed between the electrode structure 804 and an under surface of the cap layer. Electrical vias or bumps that allow the component to be electrically connected to connections on a substrate (e.g., via flip-chip or other techniques) may also be included.

Figure 9A:
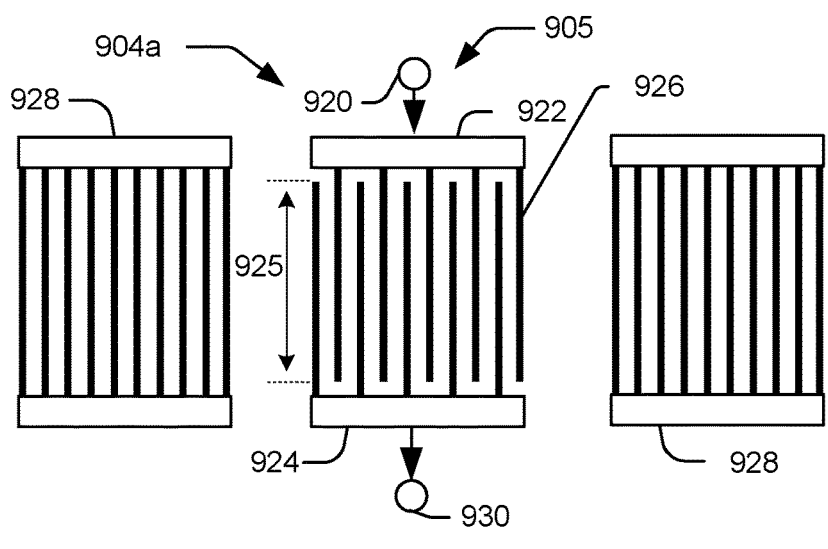
FIG. 9A is a diagram of a top view of an example of an electrode structure of an electroacoustic device for use with some examples described herein.

FIG. 9A is a diagram of a top view of an example of an electrode structure 904a of an electroacoustic device 800. The electrode structure 904a has an IDT 905 that includes a first busbar 922 (e.g., first conductive segment or rail) electrically connected to a first terminal 920 and a second busbar 924 (e.g., second conductive segment or rail) spaced from the first busbar 922 and connected to a second terminal 930. A plurality of conductive fingers 926 are connected to either the first busbar 922 or the second busbar 924 in an interdigitated manner. Fingers 926 connected to the first busbar 922 extend towards the second busbar 924 but do not connect to the second busbar 924 so that there is a small gap between the ends of these fingers 926 and the second busbar 924. Likewise, fingers 926 connected to the second busbar 924 extend towards the first busbar 922 but do not connect to the first busbar 922 so that there is a small gap between the ends of these fingers 926 and the first busbar 922.

In the direction along the busbars 922 and 924, there is an overlap region including a central region where a portion of one finger overlaps with a portion of an adjacent finger (as illustrated by the central region 925). The central region 925 including the overlap may be referred to as the aperture, track, or active region where electric fields are produced between fingers 926 to cause an acoustic wave to propagate in the piezoelectric material 802. The periodicity of the fingers 926 is referred to as the pitch of the IDT. The pitch may be indicted in various ways. For example, in certain aspects, the pitch may correspond to a magnitude of a distance between fingers in the central region 925. The distance may be defined, for example, as the distance between center points of each of the fingers (and may be generally measured between a right (or left) edge of one finger and the right (or left) edge of an adjacent finger when the fingers have uniform thickness). In certain aspects, an average of distances between adjacent fingers may be used for the pitch. The frequency at which the piezoelectric material vibrates is a self-resonance (also called a "main-resonance") frequency of the electrode structure 904a. The frequency is determined at least in part by the pitch of the IDT 905 and other properties of the electroacoustic device 800.

The IDT 905 is arranged between two reflectors 928 which reflect the acoustic wave back towards the IDT 905 for the conversion of the acoustic wave into an electrical signal via the IDT 905 in the configuration shown and to prevent losses (e.g., confine and prevent escaping acoustic waves). Each reflector 928 has two busbars and a grating structure of conductive fingers that each connect to both busbars. The pitch of the reflector may be similar to or the same as the pitch of the IDT 905 to reflect acoustic waves in the resonant frequency range. But many configurations are possible.

When converted back to an electrical signal, the converted electrical signal may be provided as an output such as one of the first terminal 920 or the second terminal 930 while the other terminal may function as an input.

A variety of electrode structures are possible. FIG. 9A may generally illustrate a one-port configuration. Other two-port configurations are also possible. For example, the electrode structure 904a may have an input IDT 905 where each terminal 920 and 930 functions as an input. In some such structures, an adjacent output IDT (not illustrated) that is positioned between the reflectors 928 and adjacent to the input IDT 905 may be provided to convert the acoustic wave propagating in the piezoelectric material 802 to an electrical signal to be provided at output terminals of the output IDT.

Figure 9B:
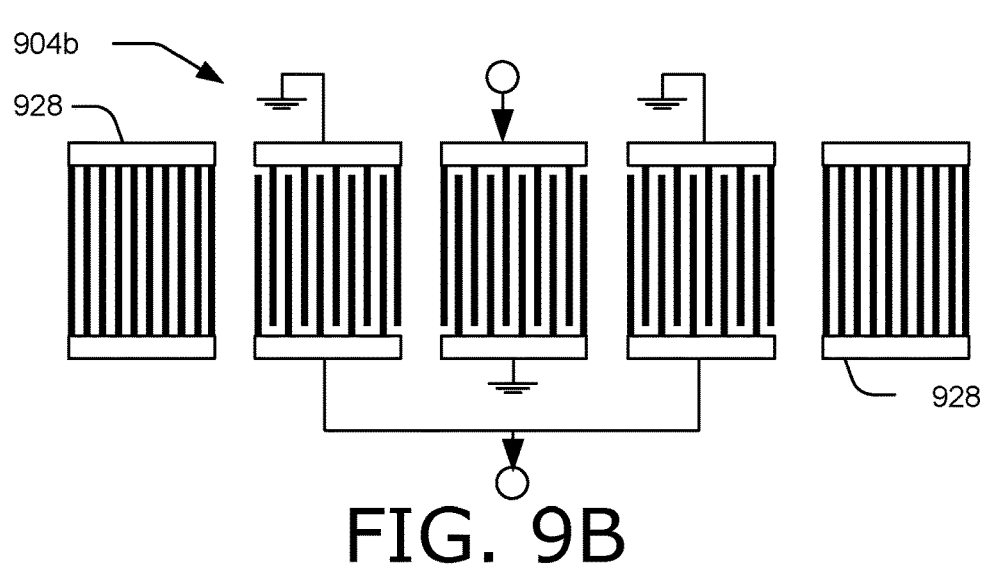
FIG. 9B is a diagram of a top view of another example of an electrode structure of an electroacoustic device for use with some examples described herein.

FIG. 9B is a diagram of a top view of another aspect of an electrode structure 904b of an electroacoustic device 800. In some cases, a dual-mode SAW (DMS) electrode structure 904b is illustrated that is a structure which may induce multiple resonances. The electrode structure 904b includes multiple IDTs along with reflectors 928 connected as illustrated. The electrode structure 904b is provided to illustrate the variety of electrode structures that principles described herein may be applied to including the electrode structures 904a and 904b of FIGS. 9A and 9B.

It should be appreciated that while a certain number of fingers 926 are illustrated, the number of actual fingers and lengths and width of the fingers 926 and busbars may be different in an actual implementation. Such parameters depend on the particular application and desired frequency of the filter. In addition, a SAW filter may include multiple interconnected electrode structures each including multiple IDTs to achieve a desired passband (e.g., multiple interconnected resonators or IDTs to form a desired filter transfer function).

Figure 10A:
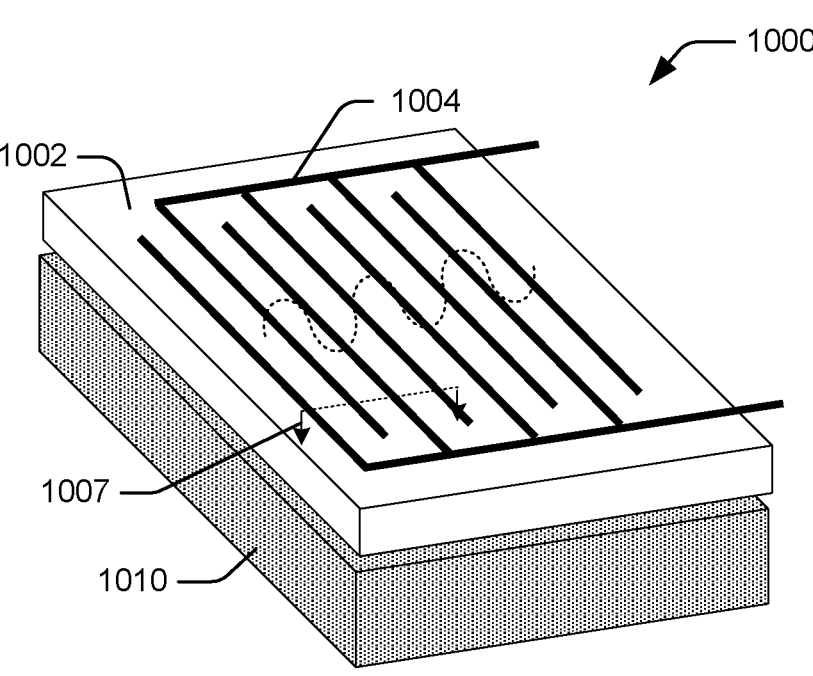
FIG. 10A is a diagram of a perspective view of another example of an electroacoustic device for use with some examples described herein.

FIG. 10A is a diagram of a perspective view of another aspect of an electroacoustic device 1000. The electroacoustic device 1000 (e.g., that may be configured as or be a part of a SAW resonator) is similar to the electroacoustic device 100 of FIG. 8A but has a different layer stack. In particular, the electroacoustic device 1000 includes a thin piezoelectric material 1002 that is provided on a substrate 1010 (e.g., silicon). The electroacoustic device 1000 may be referred to as a thin-film SAW resonator (TF-SAW) in some cases. Based on the type of piezoelectric material 1002 used (e.g., typically having higher coupling factors relative to the electroacoustic device 100 of FIG. 8A) and a controlled thickness of the piezoelectric material 1002, the particular acoustic wave modes excited may be slightly different than those in the electroacoustic device 100 of FIG. 8A. Based on the design (thicknesses of the layers, and selection of materials, etc.), the electroacoustic device 1000 may have a higher Q-factor as compared to the electroacoustic device 100 of FIG. 8A. The piezoelectric material 1002, for example, may be Lithium tantalate (LiTaO3) or some doped variant. Another example of a piezoelectric material 1002 for FIG. 10A may be Lithium niobite (LiNbO3). In general, the substrate 1010 may be substantially thicker than the piezoelectric material 1002 (e.g., potentially on the order of 50 to 100 times thicker as one example—or more). The substrate 1010 may include other layers (or other layers may be included between the substrate 1010 and the piezoelectric material 1002).

Figure 10B:
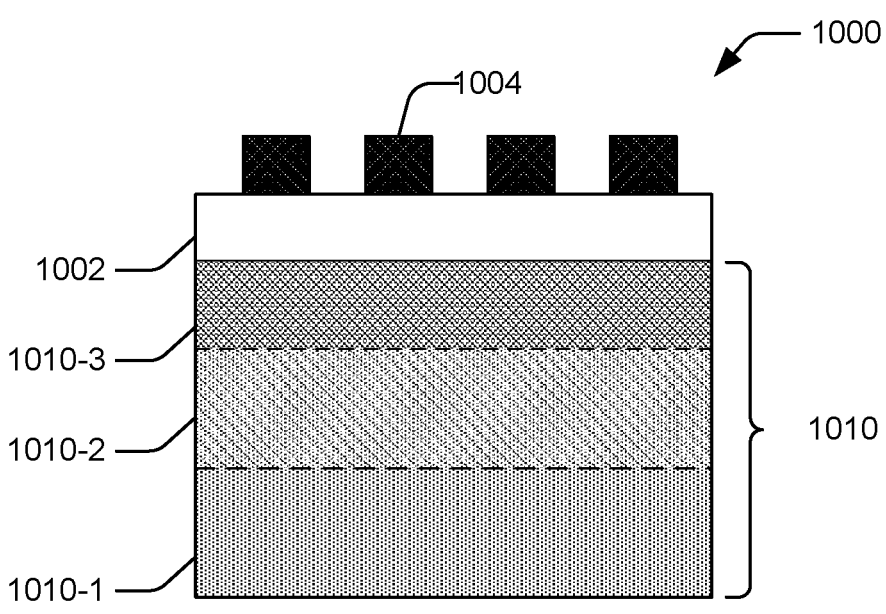
FIG. 10B is a diagram of a side view of the electroacoustic device of FIG. 10A.

FIG. 10B is a diagram of a side view of the electroacoustic device 1000 of FIG. 10A showing an exemplary layer stack (along a cross-section 1007). In the aspect shown in FIG. 10B, the substrate 1010 may include sublayers such as a substrate sublayer 1010-1 (e.g., of silicon) that may have a higher resistance (e.g., relative to the other layers—high resistivity layer). The substrate 1010 may further include a trap rich layer 1010-2 (e.g., poly-silicon). The substrate 1010 may further include a compensation layer (e.g., silicon dioxide (SiO2) or another dielectric material) that may provide temperature compensation and other properties. These sub-layers may be considered part of the substrate 1010 or their own separate layers. A relatively thin piezoelectric material 1002 is provided on the substrate 1010 with a particular thickness for providing a particular acoustic wave mode (e.g., as compared to the electroacoustic device 100 of FIG. 8A where the thickness of the piezoelectric material 102 may not be a significant design parameter beyond a certain thickness and may be generally thicker as compared to the piezoelectric material 1002 of the electroacoustic device 1000 of FIGS. 10A and 10B). The electrode structure 1004 is positioned above the piezoelectric material 1002. In addition, in some aspects, there may be one or more layers (not shown) possible above the electrode structure 1004 (e.g., such as a thin passivation layer).

Based on the type of piezoelectric material, the thickness, and the overall layer stack, the coupling to the electrode structure 1004 and acoustic velocities within the piezoelectric material in different regions of the electrode structure 1004 may differ between different types of electroacoustic devices such as between the electroacoustic device 100 of FIG. 8A and the electroacoustic device 1000 of FIGS. 10A and 10B.

As explained above, the RF Front End (RFFE) module 620 must support many different CA cases (2CA, 3CA, 4CA or also 5CA, or any other number of CA bands). Depending on the number of CA bands, the same number of filter elements or RF micro-acoustic filters are multiplexed and thus connected to one common antenna node.

Each of the multiplexed micro-acoustic filters are loaded by the imperfect out-of-band gamma of every other connected filter, leading to increased insertion loss. In some cases, one or more module filters are connected to the common antenna node only by a long transmission line due to the physically possible filter placement in the module. This long line introduces a phase shift, which must be compensated to provide an open phase to the other filters. The phase compensation comes along with additional losses.

Figure 11A:
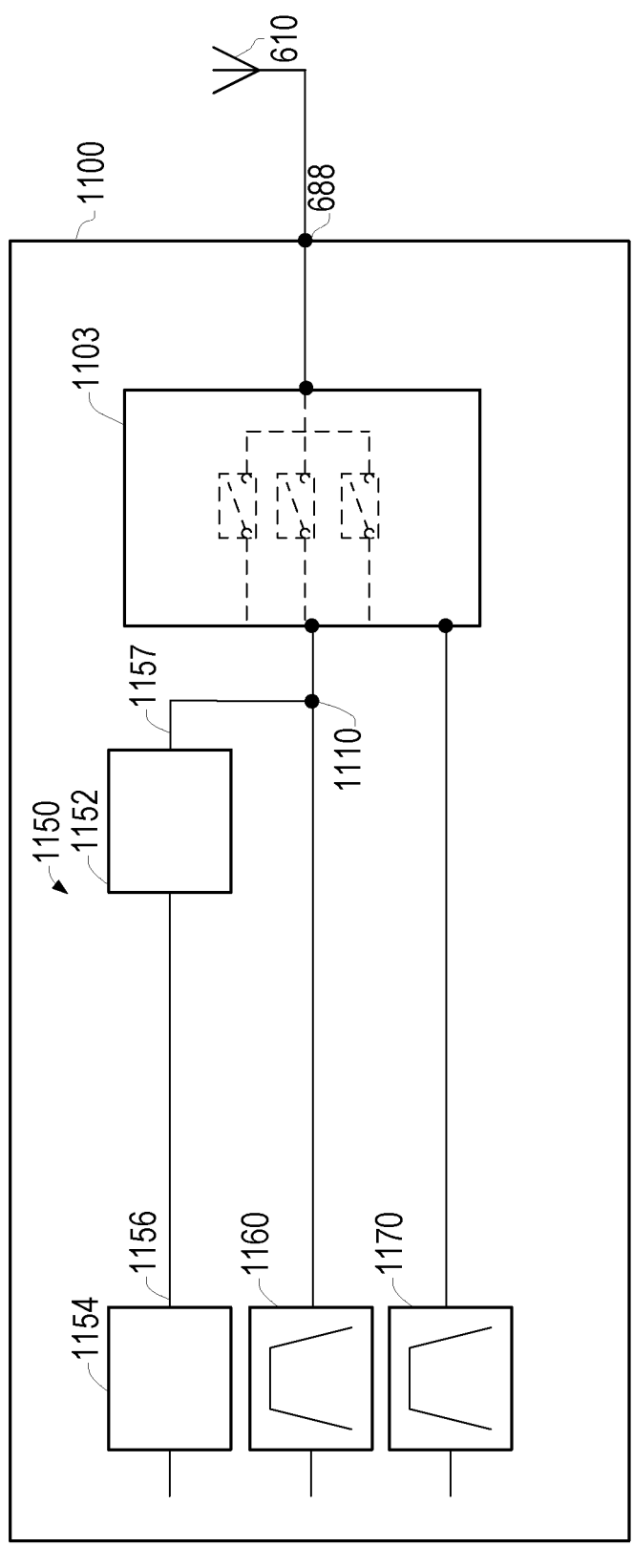
FIG. 11A is a schematic diagram of an example of a portion of a front-end circuit in accordance with aspects described herein.
Figure 11B:
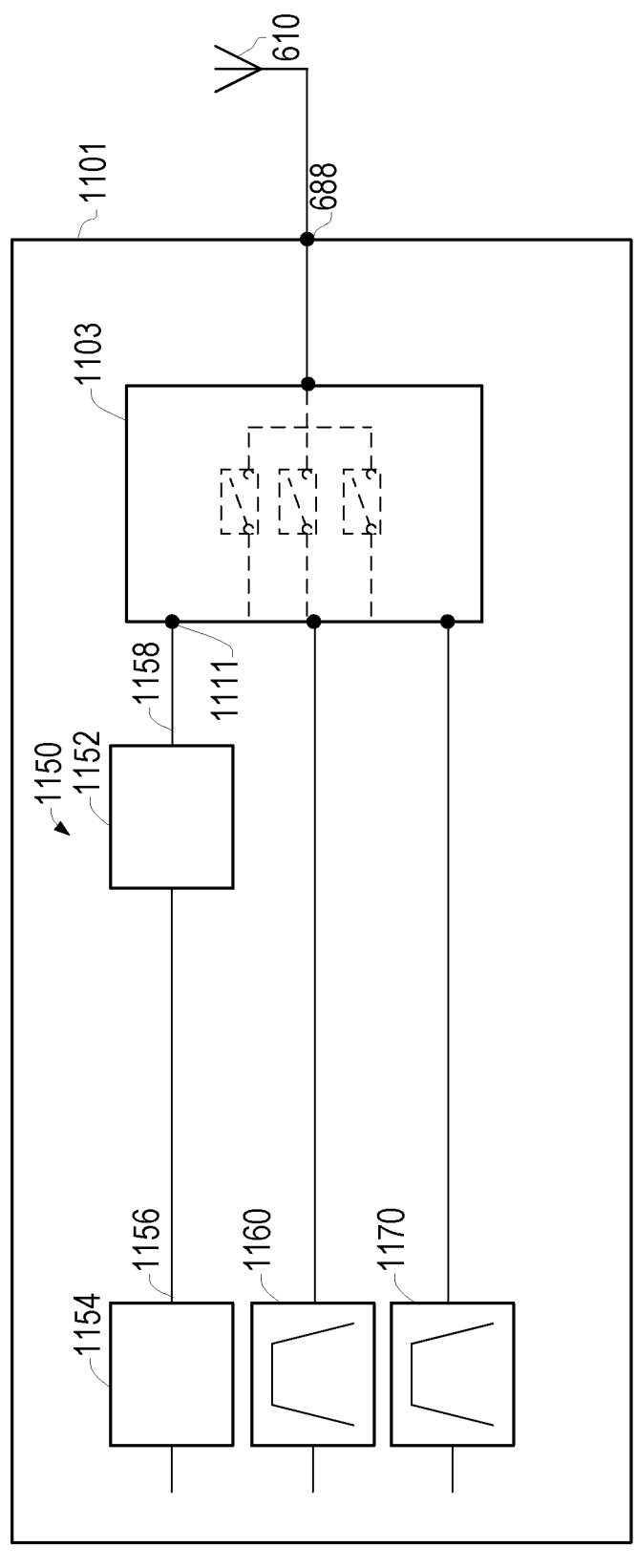
FIG. 11B is a schematic diagram of another example of a portion of a front-end circuit in accordance with aspects described herein.
Figure 11C:
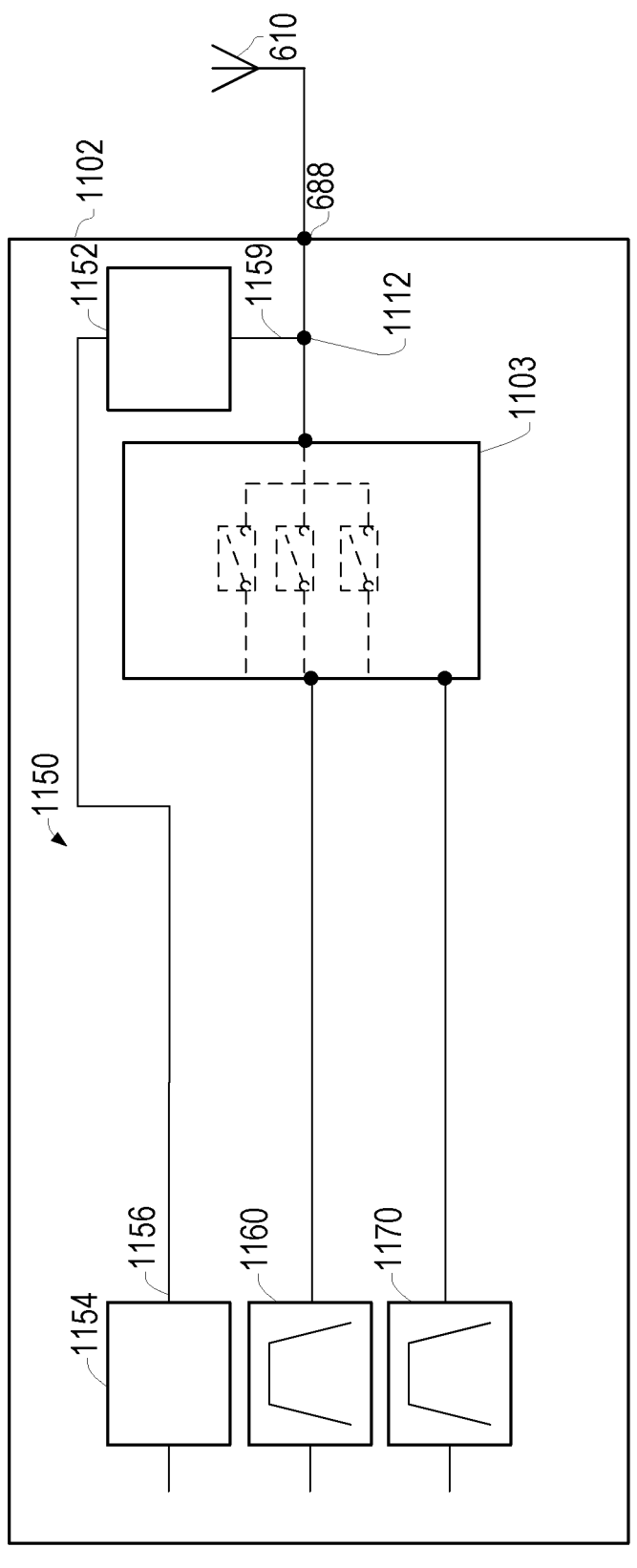
FIG. 11C is a schematic diagram of an example of a portion of a front-end circuit in accordance with aspects described herein.

An example for such a structure is shown in FIGS. 11A-11C.

FIG. 11A is a schematic diagram of an exemplary RF front end module 1100 comprising a plurality of filters 1150, 1160, 1170, which can be for instance implemented within the front end circuit 624 of FIG. 6, depending on the number of CA bands used. The front end module 1100 may be implemented in the transceiver circuit 220 of FIG. 2. The RFFE module 1100 comprises a common antenna node 688 corresponding to the connection port 688 configured to electrically connect to the antenna 610 (note that in some aspects intervening elements between the port 688 and the antenna 610 are possible but not shown for clarity (e.g., an antenna tuner, further diplexer, and the like)). An antenna switch matrix (ASM) 1103 comprises an ASM first signal terminal and two ASM second signal terminals, the ASM first signal terminal being coupled with the common antenna node 688. The plurality of filters 1150, 1160, 1170 comprises at least two RF micro acoustic filters 1150 and 1160. The RF micro acoustic filter 1150 comprises a micro acoustic pre-filter 1152 comprising a pre-filter first signal terminal and a pre-filter second signal terminal, the pre-filter first signal terminal being coupled with the ASM via a common node 1110, and a micro acoustic main-filter 1154 comprising a main-filter first signal terminal and a main-filter second signal terminal. The common node 1110 denoting the node where the pre-filter first signal terminal first couples with a signal line coupled to another filter, in the example of FIG. 11A, the filter 1160.

In an aspect, the micro acoustic main-filter and the micro acoustic pre-filter are both part of an overall filter circuit, i.e., the micro acoustic filter, (e.g., where the overall filter circuit is provided for a targeted frequency response (band-pass or the like)) but split into separate dies or the like.

The micro acoustic pre-filter 1152 and the micro acoustic main-filter 1154 are separated by a signal line 1156 coupling the pre-filter second signal terminal to the main-filter first signal terminal. Preferably, the micro acoustic pre-filter 1152 is on a different die than the micro acoustic main-filter 1154 and coupled by the signal line 1156. The above described structure provides a fixplexed or fix connection of the RF micro acoustic filter 1150, respectively the micro acoustic pre-filter 1152 and the RF micro acoustic filter 1160.

The ASM can provide for the multiplexing and aggregation of the CA bands in the RFFE module 1101 in an extended multiplexer configuration including the filter 1170.

The pre-filter 1152 first signal terminal is coupled with a first signal line 1157 with the common node 1110. The micro acoustic filter 1160 of the at least two RF micro acoustic filters is coupled with a second signal line with the common node 1110. The common node 1110 is further coupled with a further signal line with the respective ASM second signal terminal.

The line length of the first signal line 1157 between the common node 1110 and the pre-filter first signal terminal is shorter than a line length of said signal line 1156 between the pre-filter second signal terminal and the main-filter first signal terminal. Placing the RF micro acoustic pre-filter 1152 close to the common node 1110 reduces the insertion loss, and reduces the loading effect on the filter 1160.

In an aspect and in conjunction with the shorter line length of the signal line 1156, the physical distance between the pre-filter 1152 and the common node 1110 is shorter than the physical distance between the main-filter 1154 and the common node 1110 based on a positioning of the pre-filter 1152 within the RFFE module 1101 to be closer to the common node 1110 (and in some aspects also closer to the ASM 1103)). In some aspects, the physical distance between the pre-filter 1152 and the common node 1110 (and potentially closer to the ASM 1103) may be greater than the physical distance between the main-filter 1154 and the pre-filter 1152.

FIG. 11B is a schematic diagram of an exemplary RF front end module 1101 largely corresponding to the structure of FIG. 11A. The antenna switch matrix (ASM) 1103 comprises the ASM first signal terminal and three ASM second signal terminals, the ASM first signal terminal being coupled with the common antenna node 688. The pre-filter first signal terminal is coupled with a respective ASM second signal terminal of the three ASM second signal terminals and the respective ASM second signal terminal defines the common node 1111. The actual common node (not shown) coupling the three (in the present example of FIG. 11B) ASM second signal terminals would be internal of the ASM. However, for the ease of reference, the common node 1111 is placed at the respective ASM second signal terminal, which is still close to the actual common node (not shown). The micro acoustic pre-filter 1152 and the micro acoustic main-filter 1154 are separated by the signal line 1156 coupling the pre-filter second signal terminal to the main-filter first signal terminal. Preferably, the micro acoustic pre-filter 1152 is on a different die than the micro acoustic main-filter 1154 and coupled by the signal line 1156.

The above described structure provides a flexible connection of the RF micro acoustic filter 1150, respectively the micro acoustic pre-filter 1152, the RF micro acoustic filter 1160 and/or the filter 1170 via the ASM to the common antenna node 688.

The pre-filter 1152 first signal terminal is coupled with a first signal line 1158 with the common node 1111. The line length of the first signal line 1158 between the common node 1111 and the pre-filter first signal terminal is shorter than a line length of said signal line 1156 between the pre-filter second signal terminal and the main-filter first signal terminal. Placing the RF micro acoustic pre-filter close to the common node 1111 reduces the insertion loss and reduces the loading effect on the filters 1160 and 1170.

FIG. 11C is a schematic diagram of an exemplary RF front end module 1102 largely corresponding to the structure of FIG. 11A. The antenna switch matrix (ASM) 1103 comprises the ASM first signal terminal and two ASM second signal terminals, the ASM first signal terminal being coupled with the common antenna node 688.

The pre-filter first signal terminal is coupled at a coupling node 1112 with the ASM first signal terminal, wherein said coupling node 1112 defines the common node 1112. The above described structure provides a fixplexed ASM connection at the common node 1112 with the RF micro acoustic filter 1150, respectively the micro acoustic pre-filter 1152 and, via the ASM, the RF micro acoustic filter 1160 and/or the filter 1170.

In an aspect the line length of a first signal line 1159 between the common node 1112 and the pre-filter first signal terminal is shorter than a line length of said signal line 1156 between the pre-filter second signal terminal and the main-filter first signal terminal. Placing the RF micro acoustic pre-filter close to the common node 1112 reduces the insertion loss and reduces the loading effect on the filters 1160 and 1170.

While not shown in FIGS. 11A-11C, like the RF micro acoustic filter 1150, also the RF micro acoustic filter 1160 can comprise a further respective micro acoustic pre-filter and a further respective micro acoustic main-filter. Also the filter 1170 can be a RF micro acoustic filter 1170, and likewise comprising a further respective micro acoustic pre-filter and a further respective micro acoustic main-filter. The respective micro acoustic pre-filter comprises a respective pre-filter first signal terminal and a respective pre-filter second signal terminal, and the respective micro acoustic main-filter comprises a respective main-filter first signal terminal and a respective main-filter second signal terminal. A sum of line lengths between the common node and all of the pre-filter first signal terminals is shorter than a sum of line lengths between all of the pre-filter second signal terminals and the respective main-filter first signal terminals.

While not shown in FIGS. 11A-11C, the two micro acoustic pre-filters (of the RF micro acoustic filter 1150 and the RF micro acoustic filter 1160) are preferably on a same die, which is different from one or more dies where the micro acoustic main-filters are located. Depending on the number of CA bands used, more or less filters than shown in the Figures may be implemented.

Some RFFE modules need to support an, e.g., customer or other party, provided optional external filter for a specific CA band which must be multiplexed with internal filters. For good CA performance the out-of-band gamma of the internal and external filters need to be well aligned. But usually, the properties of the external filter and the external matching configuration is not known in the module design. In that case using a micro acoustic pre-filter close to a common node provides advantages.

Figure 12A:
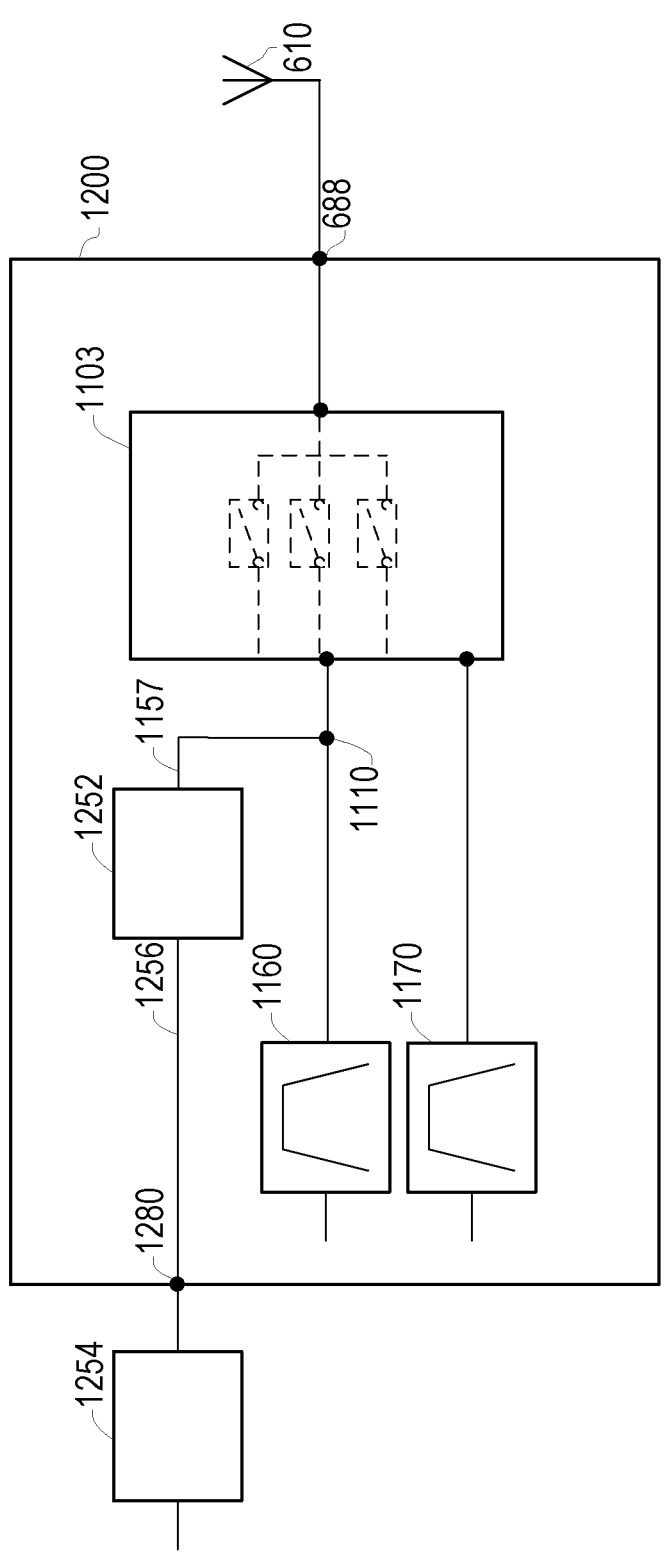
FIG. 12A is a schematic diagram of an example of a portion of a front-end circuit in accordance with aspects described herein.
Figure 12B:
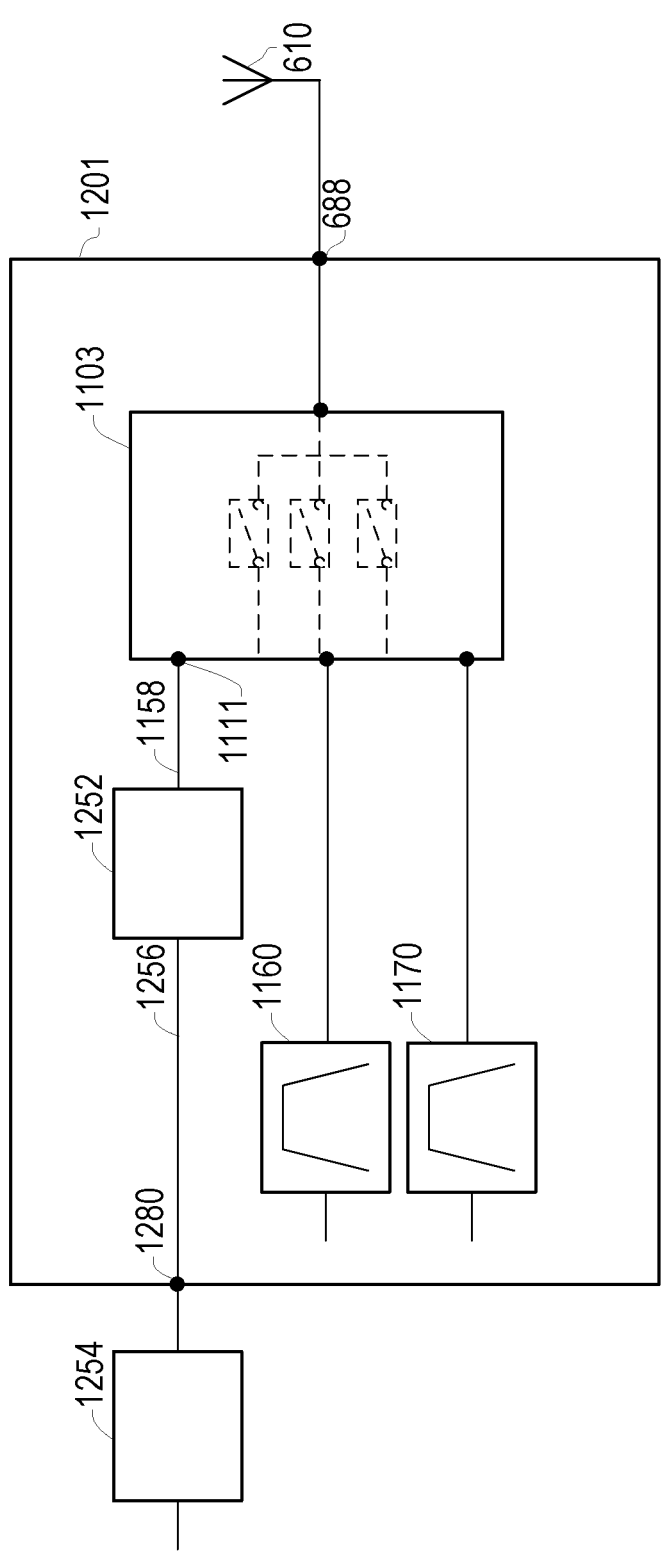
FIG. 12B is a schematic diagram of an example of a portion of a front-end circuit in accordance with aspects described herein.
Figure 12C:
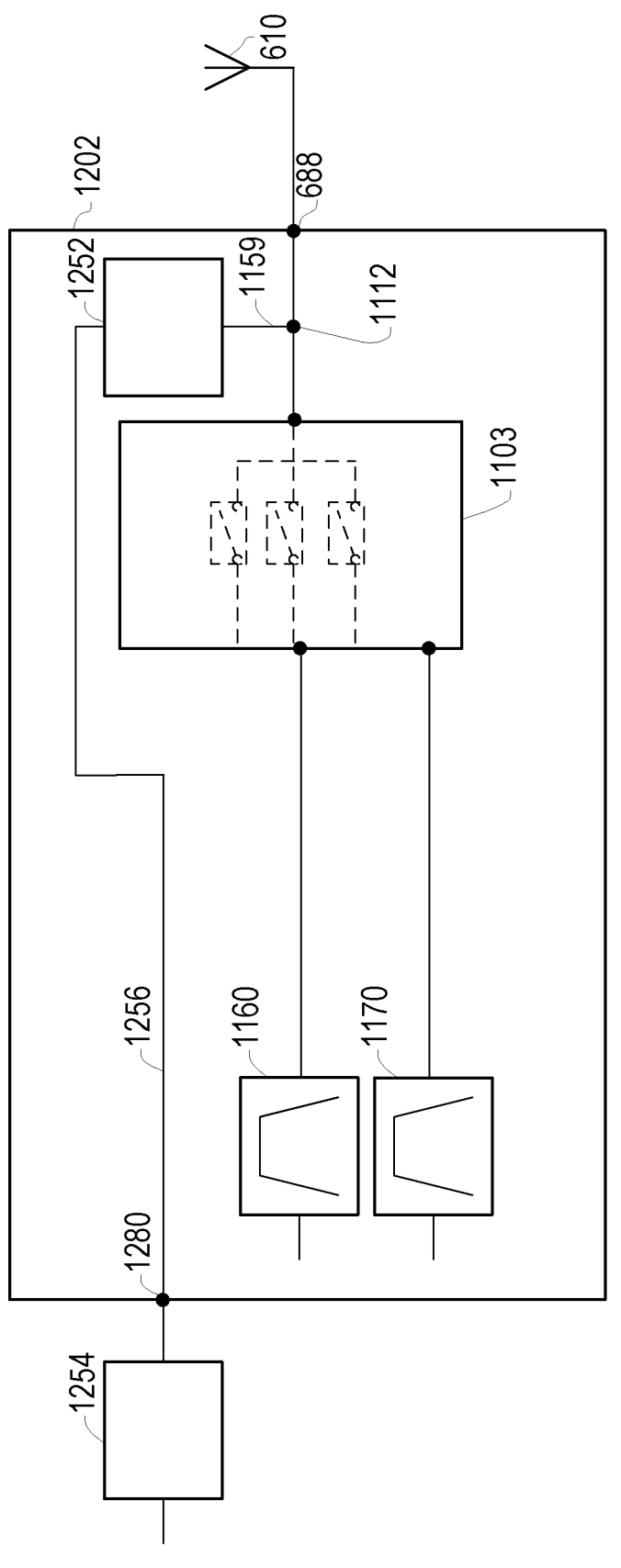
FIG. 12C is a schematic diagram of an example of a portion of a front-end circuit in accordance with aspects described herein.

An example for such a structure is shown in FIGS. 12A-12C, largely corresponding to FIGS. 11A-11C, as can be seen by the respective reference signs.

FIG. 12A is a schematic diagram of an exemplary RF front end module 1200 comprising a micro acoustic pre-filter 1252 comprising a pre-filter first signal terminal and a pre-filter second signal terminal, the pre-filter first signal terminal being coupled with the ASM via a common node 1110. The RF front end module 1200 comprises further a module signal terminal 1280. The pre-filter second signal terminal is coupled to the module signal terminal 1280 by a signal line 1256. An external filter component 1254 can be coupled to the module signal terminal 1280. In an aspect the combined filter of the micro acoustic pre-filter 1252 and the external filter component 1254 has a common passband band (or an overall single targeted frequency response). In a further aspect the micro acoustic pre-filter sharpens some of the filter skirts where the external filter component could stand alone if needed. In another aspect both the external filter component and the micro acoustic pre-filter together provide the desired frequency response (i.e., external filter component is incomplete without the micro acoustic pre-filter).

The plurality of filters 1160, 1170 comprises at least one RF micro acoustic filter 1160. The micro acoustic filter 1160 is coupled with a second signal line with the common node 1110. The common node 1110 is further coupled with a further signal line with the respective ASM second signal terminal.

The above described structure provides a fixplexed or fix connection of the micro acoustic pre-filter 1252 (respectively the external filter component 1254) and the RF micro acoustic filter 1160.

In an aspect, the line length of the first signal line 1157 between the common node 1110 and the pre-filter first signal terminal is shorter than a line length of said signal line 1256 between the pre-filter second signal terminal and the module signal terminal 1280. Alternatively, the line length of the first signal line 1157 between the common node 1110 and the pre-filter first signal terminal is shorter than the line length between the pre-filter second signal terminal and the external filter component 1254. In an aspect, the pre-filter 1252 is physically positioned closer to the common node 1110 (and potentially the ASM 1103) than to the module signal terminal 1280. Placing the RF micro acoustic pre-filter 1252 close to the common node 1110 reduces the insertion loss and reduces the loading effect on the filter 1160.

FIG. 12B is a schematic diagram of an exemplary RF front end module 1201 largely corresponding to the structure of FIGS. 12A and 11B. The pre-filter first signal terminal is coupled with a respective ASM second signal terminal of the three ASM second signal terminals and the respective ASM second signal terminal defines the common node 1111. The signal line 1256 coupling the pre-filter second signal terminal of the micro acoustic pre-filter 1252 to the module signal terminal 1280. The above described structure provides a flexible connection of the micro acoustic pre-filter 1152 (respectively the external filter component 1254), the RF micro acoustic filter 1160 and/or the filter 1170 via the ASM to the common antenna node 688.

The pre-filter 1252 first signal terminal is coupled with a first signal line 1158 with the common node 1111. The line length of the first signal line 1158 between the common node 1111 and the pre-filter first signal terminal is shorter than a line length of said signal line 1256 between the pre-filter second signal terminal and the module signal terminal 1280. In an aspect, the physical distance between the pre-filter 1252 and the common node 1111 is shorter than the physical distance between module signal terminal 1280 and the pre-filter 1252. Placing the RF micro acoustic pre-filter 1252 close to the common node 1111 reduces the insertion loss and reduces the loading effect on the filters 1160 and 1170.

FIG. 12C is a schematic diagram of an exemplary RF front end module 1202 largely corresponding to the structure of FIGS. 12A and 11C. The pre-filter first signal terminal is coupled at a coupling node 1112 with the ASM first signal terminal, wherein said coupling node 1112 defines the common node 1112. The above described structure provides a fixplexed or fix post ASM connection with the micro acoustic pre-filter 1252 (respectively the external filter component 1254) and the RF micro acoustic filter 1160 and/or the filter 1170.

The line length of a first signal line 1159 between the common node 1112 and the pre-filter first signal terminal is shorter than a line length of said signal line 1256 between the pre-filter second signal terminal and module signal terminal 1280. In an aspect, the physical distance between the pre-filter 1252 and the common node 1111 is shorter than the physical distance between module signal terminal 1280 and the pre-filter 1252. Placing the RF micro acoustic pre-filter close to the common node 1112 reduces the insertion loss and reduces the loading effect on the filters 1160 and 1170.

While not shown in FIGS. 12A-12C (similar to FIGS. 11A-11C), the RF micro acoustic filter 1160 can comprise a further respective micro acoustic pre-filter and a further respective micro acoustic main-filter. Also the filter 1170 can be a RF micro acoustic filter 1170, and likewise comprising a further respective micro acoustic pre-filter and a further respective micro acoustic main-filter. The respective micro acoustic pre-filter comprises a respective pre-filter first signal terminal and a respective pre-filter second signal terminal, and the respective micro acoustic main-filter comprises a respective main-filter first signal terminal and a respective main-filter second signal terminal. A sum of line lengths between the common node and all of the pre-filter first signal terminals is shorter than a sum of line lengths between all of the pre-filter second signal terminals and the respective main-filter first signal terminals. While not shown, the two micro acoustic pre-filters (micro acoustic pre-filter 1252 and the respective micro acoustic pre-filter of the RF micro acoustic filter 1160) are preferably on a same die, which is different from one or more dies where the respective micro acoustic main-filter and possibly further micro acoustic (main-)filters are located.

While not shown in FIGS. 12A-12C (similar to FIGS. 11A-11C), the micro acoustic pre-filter comprises one first filter stage, the first filter stage being one series resonator or one shunt resonator. Alternatively, the micro acoustic pre-filter has one or more resonators, the total number of the one or more resonators is less than or equal to a number of resonators of the micro acoustic main-filter. In a further aspect, the micro acoustic pre-filter comprises at least two filter stages, the first filter stage of the at least two filter stages being a series resonator. In a further aspect, the micro acoustic pre-filter comprising at least one first filter stage, the first filter stage being one series and one shunt resonator. In an aspect, the micro acoustic pre-filter and the micro acoustic main-filter are both surface acoustic wave (SAW) filter but have different layer stacks. Preferably, the micro acoustic pre-filter is built from a thin film SAW (TF-SAW) layer stack. In another aspect, the micro acoustic pre-filter is a bulk acoustic wave (BAW) filter, and the micro acoustic main-filter is a surface acoustic wave (SAW) filter.

While not shown in FIGS. 12A-12C (similar to FIGS. 11A-11C), the Quality factor of the resonators of the micro acoustic pre-filter is better than or equal to the Quality factor of the resonators of the micro acoustic main-filter. In one aspect, the electroacoustic coupling factor of the resonators of the micro acoustic pre-filter is higher than the electroacoustic coupling factor of the resonators of the micro acoustic main-filter.

Figure 13A:
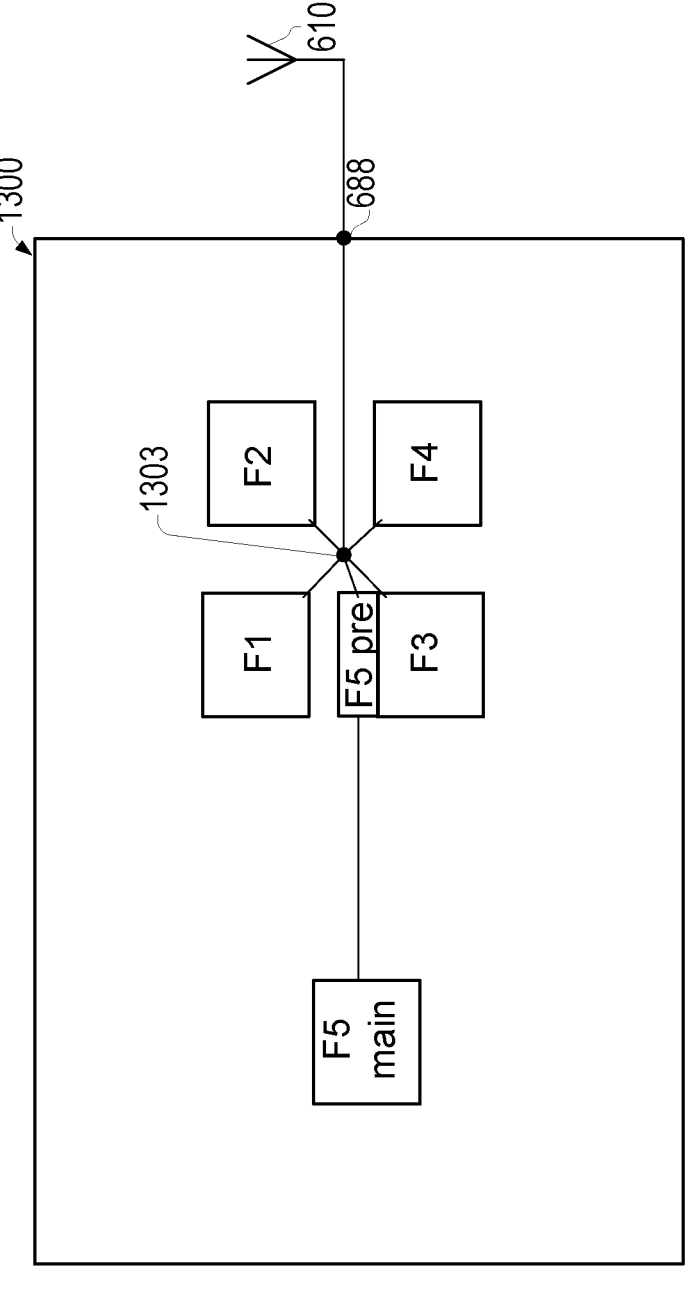
FIG. 13A is a schematic diagram of an example of a portion of a front-end circuit with several band filters in accordance with aspects described herein.
Figure 13B:
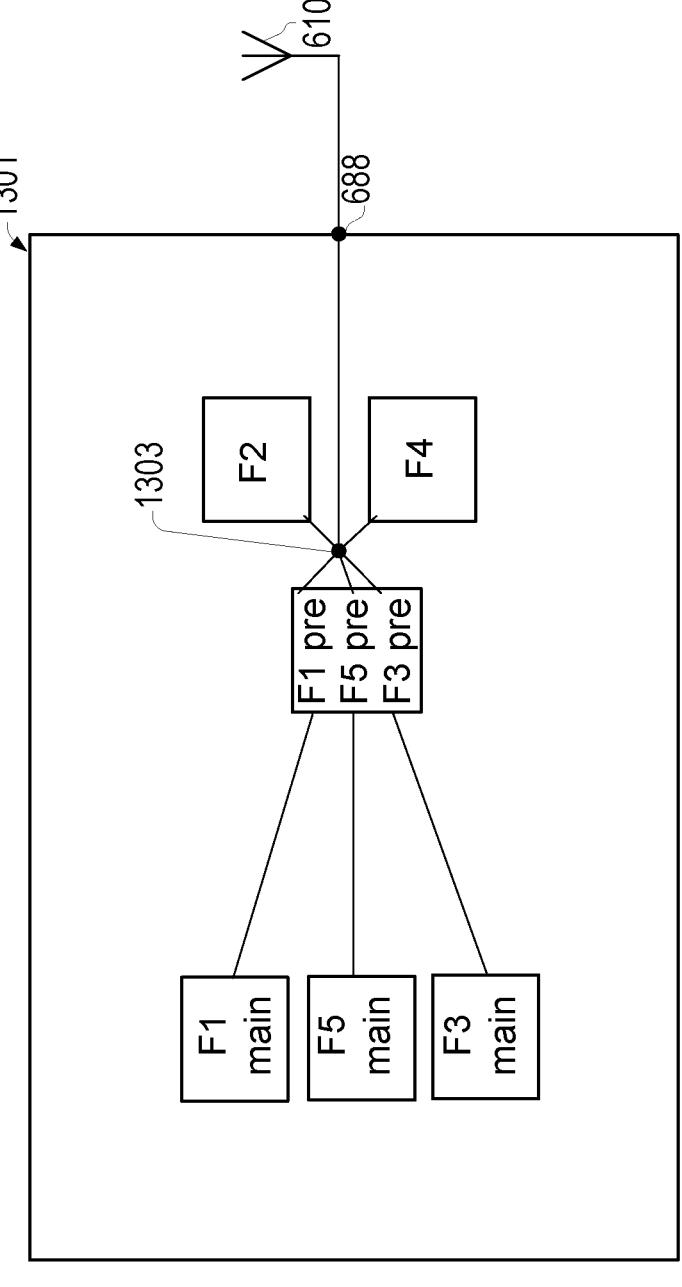
FIG. 13B is a schematic diagram of an example of a portion of a front-end circuit with several band filters in accordance with aspects described herein.

FIGS. 13A and 13B show examples for the pre-filter and main-filter concept and the placement of the same and different dies as mentioned in the context of FIGS. 11A-11C and FIGS. 12A-12C.

FIG. 13A is a schematic diagram of an exemplary RF front end module 1300 comprising a plurality of filters F1-F5. The filters F1-F5 are coupled at a node 1303 which is coupled to the connection port 688 configured to electrically connect to the antenna 610. The node 1303 can also be formed by the ASM 1103 as described above so as to provide a flexible coupling of the filters F1-F5 to the connection port.

As can be seen filters could be connected to the node 1303, only by a long transmission line due to the physically possible filter placement in the module (see filter F5). However, separating acoustic filters into two parts called the micro acoustic main-filter (F5 main) and micro acoustic pre-filter (F5 pre) and placing the micro acoustic pre-filter (F5 pre) close to the node 1303 provides advantages. The micro acoustic pre-filter is connected to the node 1303 via a short signal line. The unwanted signal line or transmission line induced phase shift is now significantly reduced. In FIG. 13A, the filters F1-F4, F5 main and F5 pre are shown on separate dies. In an optional aspect, the micro acoustic pre-filter (F5 pre) can be on the same die as the filter F3. In a further aspect one or more of the filters can be on a same die.

FIG. 13B is a schematic diagram of an exemplary RF front end module 1301 largely corresponding to the structure of FIG. 13A and likewise comprising a plurality of filters F1-F5. As can be seen filters F1, F3 and F5 could be connected to the node 1303, only by long transmission lines due to the physically possible filter placement in the module. However, separating acoustic filters into two parts called the micro acoustic main-filter (F1, F3, F5 main) and micro acoustic pre-filter (F1, F3, F5 pre) and placing the micro acoustic pre-filters close to the node 1303 provides advantages. The micro acoustic pre-filters are connected to the node 1303 via short signal lines. The unwanted signal line or transmission line induced phase shift is now significantly reduced. The micro acoustic pre-filters (F1, F3, F5 pre) can be on the same die. This would also make it easy to manufacture the resonators of the micro acoustic pre-filters with a higher Quality factor than the resonators of the micro acoustic main-filters. This would also provide for a more cost efficient implementation avoiding to manufacture all filters with the same Quality factor separately (i.e., on separate dies). Thus, the pre-filter concept allows to use a higher Quality factor material only where needed to obtain the better out-of-band gamma, avoiding the full-blown cost of all full filters in high Quality factor material. The high Quality factor material of the micro acoustic pre-filter is already sufficient to obtain a low multiplexing loss.

A RFFE module using in the multiplexer topology acoustic filters split into a micro acoustic pre-filter and a micro acoustic main-filter allows for more filters and thus more bands to have a close proximity of the filter to the node 1303 and thus eventually to the antenna.

A shorter line length in front of the filter reduces the input capacitance of the filter and thus allows the matching with a larger input matching coil (shunt coil for multiplexing). Larger shunt coil and smaller filter input capacitance leads to a reduced phase slope with respect to the frequency seen by any other filter coupled to the node 1303, respectively the ASM 1103 (the multiplexer). A reduced phase slope in general leads to better performance (lower insertion loss and better matching) to the other bands connected to the node 1303. A larger shunt coil provides lower matching losses by its Q-factor itself and by its smaller rotation in the smith-chart. The pre-filter concept allows to use a shorter line length in front of the pre-filter and, as mentioned above, a higher Q-material only where needed to obtain the better Out-of-band gamma, avoiding the full-blown cost of all full filters in high Q-material.

As explained above, the RF Front End module 620 must support many different CA cases (2CA, 3CA, 4CA or also 5CA, or any other number of CA bands). Depending on the number of CA bands, the same number of filter elements or RF micro-acoustic filters are multiplexed and thus connected to one common antenna node.

In one aspect, depending on the CA bands used, two or more RF micro acoustic filters may each have a micro acoustic main-filter and share a common micro acoustic pre-filter. For instance band B7 is between 2620 MHz and 2690 MHz, band B41 is between 2496 MHz and 2690 MHz. In an aspect two or more filters can share a common pre-filter when the filter bands share the same band, share a subband, or the bands are at least partially overlapping, or the bands are close to each other.

Figure 14:
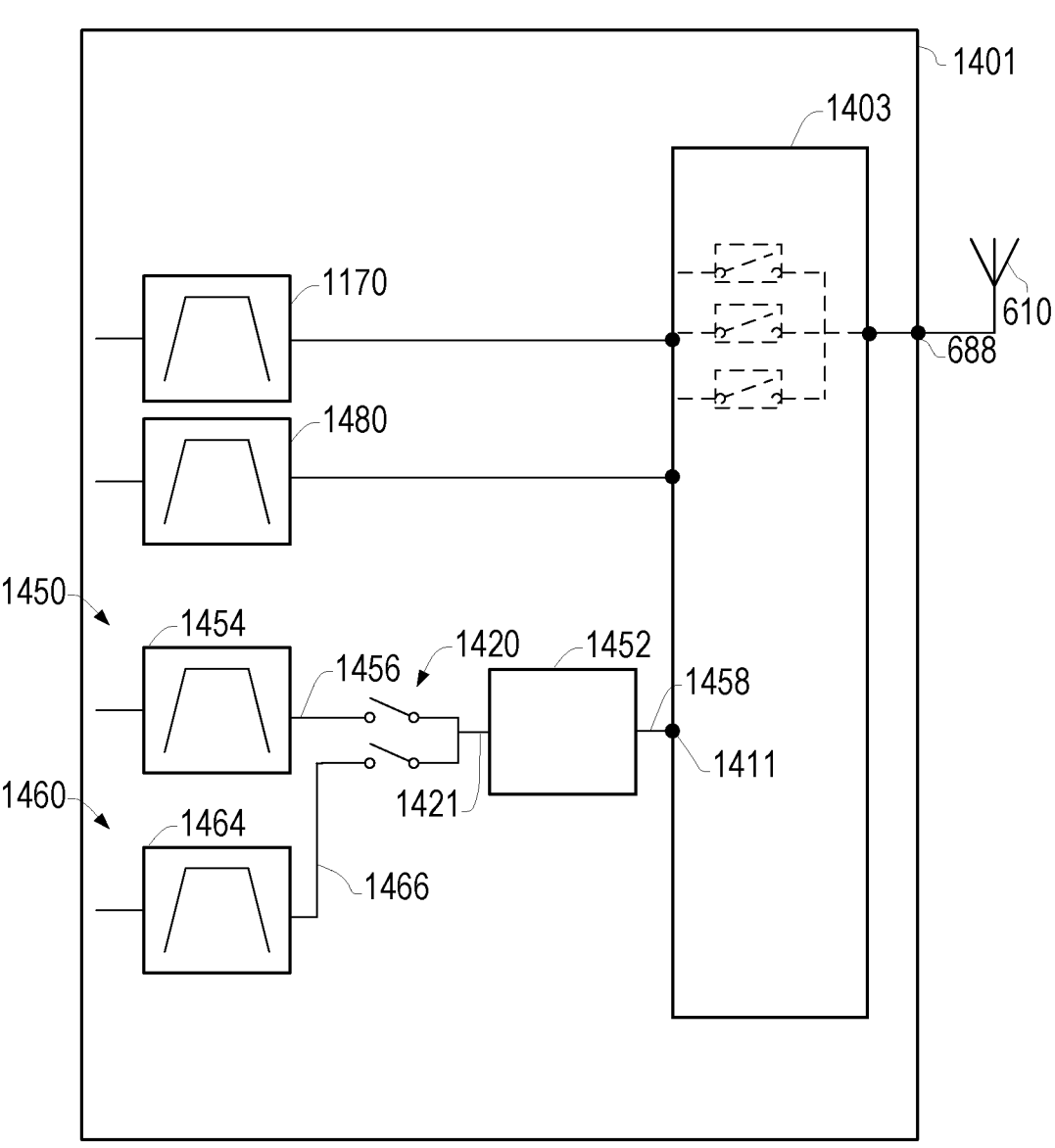
FIG. 14 is a schematic diagram of an example of a portion of a front-end circuit in accordance with aspects described herein.

An example for such a structure is shown in FIG. 14, largely corresponding to FIGS. 11A-11C, as can be seen by the respective reference signs. While FIG. 14 is based at first sight to the structure FIG. 111B, a structure based on FIGS. 11A and 11C, respectively, is also possible.

FIG. 14 is a schematic diagram of an exemplary RF front end module 1401 comprising a plurality of filters 1450, 1460, 1170, 1480, which can be for instance implemented within the front end circuit 624 of FIG. 6, depending on the number of CA bands used. The front end module 1401 may be implemented in the transceiver circuit 220 of FIG. 2. The RFFE module 1401 comprises a common antenna node 688 corresponding to the connection port 688 configured to electrically connect to the antenna 610 (note that in some aspects intervening elements between the port 688 and the antenna 610 are possible but not shown for clarity (e.g., an antenna tuner, further diplexer, and the like)). An ASM 1403 comprises an ASM first signal terminal and three ASM second signal terminals, the ASM first signal terminal being coupled with the common antenna node 688. The plurality of filters 1450, 1460, 1170, 1480, comprises at least two RF micro acoustic filters 1450 and 1460, a first RF micro acoustic filter 1450 and a second RF micro acoustic filter 1460.

The RF front end module 1401 comprises further a switch 1420. The first RF micro acoustic filter 1450 comprises a first micro acoustic main-filter 1454 comprising a first main-filter first signal terminal and a first main-filter second signal terminal. The switch 1420 and the first micro acoustic main-filter 1454 are separated by a signal line 1456 coupling the switch 1420 to the first main-filter first signal terminal. The RF micro acoustic filter 1460 comprises a second micro acoustic main-filter 1464 comprising a second main-filter first signal terminal and a second main-filter second signal terminal. The switch 1420 and the second micro acoustic main-filter 1464 are separated by a signal line 1466 coupling the switch 1420 to the second main-filter first signal terminal.

The RF front end module 1401 comprises further a micro acoustic pre-filter 1452 comprising a pre-filter first signal terminal and a pre-filter second signal terminal, the pre-filter first signal terminal being coupled with the ASM via a common node 1411. The pre-filter second signal terminal is coupled to the switch 1420 by a signal line 1421.

Instead of a fixplexed or fix connection, the switch 1420 provides a switchplexed or switchable coupling between the signal line 1421 on one side and the signal lines 1456 and 1466, respectively, on the other side of the switch 1420.

In an aspect, the RF micro acoustic filter 1450 is for band B41 and the RF micro acoustic filter 1460 is for band B7. In an aspect, only one of the bands B7 and B41 is used at a time. Thus, since the two bands are largely overlapping (in fact band B7 is contained in band B41), the two RF micro acoustic filters 1450 and 1460 may each have the respective micro acoustic main-filter 1454 and 1464 and share the common micro acoustic pre-filter 1452. The common micro acoustic pre-filter 1452 being broad enough to cover the larger of the two bands, i.e., B41, and together with the first RF micro acoustic filter 1450 adapted to the band B41, while the common micro acoustic pre-filter 1452 together with the second RF micro acoustic filter 1460 being adapted to the band B7. The switch 1420 couples either the first RF micro acoustic filter 1450 or the second RF micro acoustic filter 1460 to the micro acoustic pre-filter 1452. The switch 1420 provides for a flexible structure with two RF micro acoustic filters 1450 and 1460 while needing only one common micro acoustic pre-filter 1452. In an aspect, e.g., while one or more of the other filters 1170 and 1480 is used, the switch 1420 may not couple any of the two RF micro acoustic filters 1450 and 1460 to the common micro acoustic pre-filter 1452.

The line length of the first signal line 1458 between the common node 1411 and the pre-filter first signal terminal is shorter than a line length of said signal line 1421, the signal line 1456 and via the switch 1420 between the pre-filter second signal terminal and the first main-filter first signal terminal. The line length of the first signal line 1458 between the common node 1411 and the pre-filter first signal terminal is also shorter than a line length of said signal line 1421, the signal line 1466, and via the switch 1420 between the pre-filter second signal terminal and the second main-filter first signal terminal. Placing the RF micro acoustic pre-filter close to the common node 1411 reduces the insertion loss and reduces the loading effect on the filter 1170 and 1480.

In a further aspect, depending on the desired bands (respectively bandwidths) more than two RF micro acoustic filters can share a common micro acoustic pre-filter using a respective switch. Thus, the structure and reduces the number of micro acoustic pre-filters to one common micro acoustic pre-filter.

In a further aspect, the structure of FIG. 14 can be adapted to the structure as shown in FIGS. 12A-12C in a similar manner as the structure of FIGS. 11A-11C.

Figure 15:
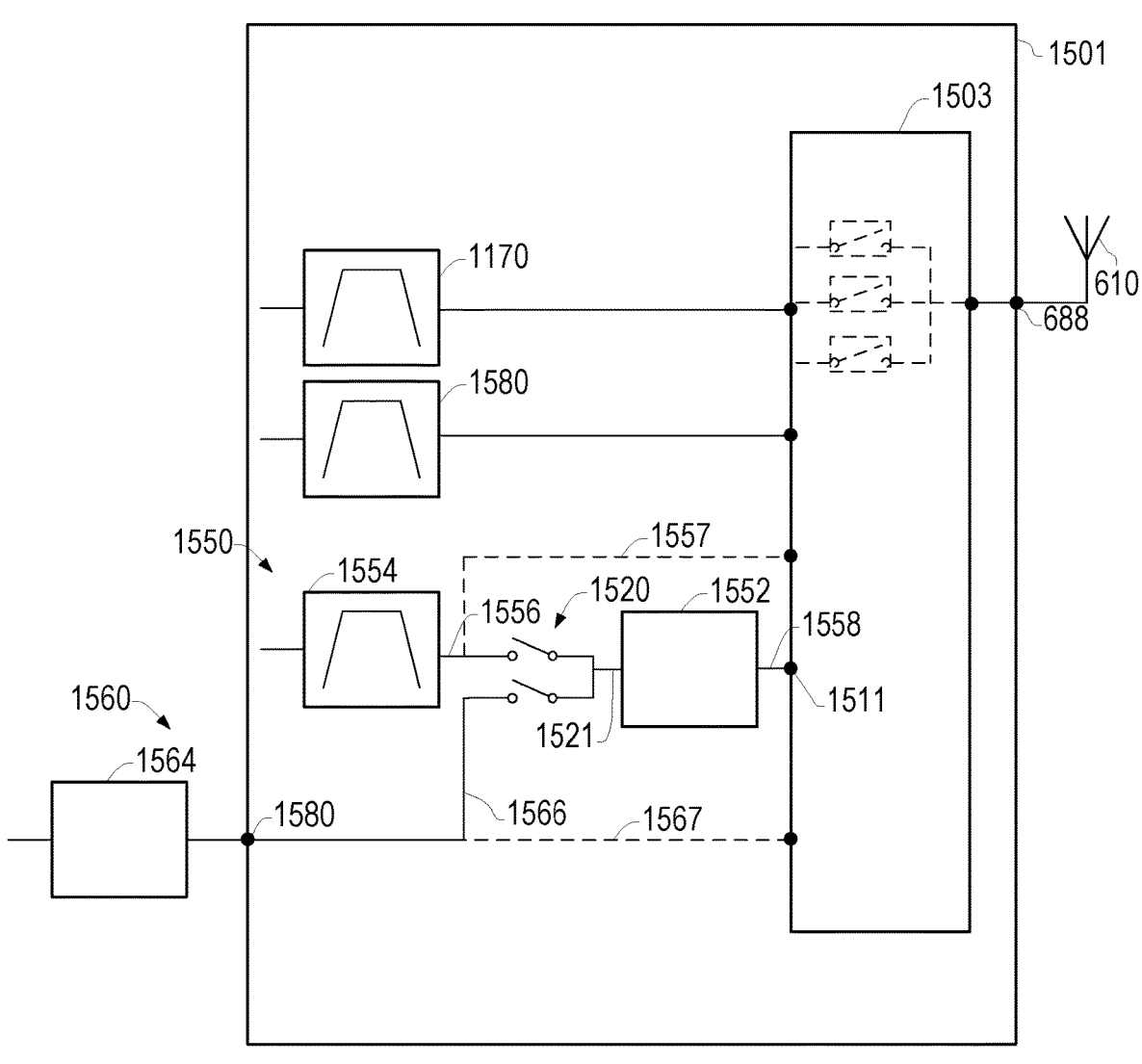
FIG. 15 is a schematic diagram of an example of a portion of a front-end circuit in accordance with aspects described herein.

In one aspect such a structure is shown in FIG. 15.

FIG. 15 is a schematic diagram of an exemplary RF front end module 1501 largely corresponding to the structure of FIGS. 14, 12B and 11B.

The RF front end module 1501 comprising a plurality of filters 1550, 1170, 1580, which can be for instance implemented within the front end circuit 624 of FIG. 6, depending on the number of CA bands used. The front end module 1501 may be implemented in the transceiver circuit 220 of FIG. 2. The RFFE module 1501 comprises a common antenna node 688 corresponding to the connection port 688 configured to electrically connect to the antenna 610 (note that in some aspects intervening elements between the port 688 and the antenna 610 are possible but not shown for clarity (e.g., an antenna tuner, further diplexer, and the like)). An ASM 1503 comprises an ASM first signal terminal and five ASM second signal terminals (comprising two optional ASM second signal terminals depicted at the end of the dashed lines), the ASM first signal terminal being coupled with the common antenna node 688. The plurality of filters 1550, 1170, 1580, comprises at least a first RF micro acoustic filter 1550.

The RF front end module 1501 comprises further a switch 1520. The first RF micro acoustic filter 1550 comprises a first micro acoustic main-filter 1554 comprising a first main-filter first signal terminal and a first main-filter second signal terminal. The switch 1520 and the first micro acoustic main-filter 1554 are separated by a signal line 1556 coupling the switch 1520 to the first main-filter first signal terminal.

The RF front end module 1501 comprises further a micro acoustic pre-filter 1552 comprising a pre-filter first signal terminal and a pre-filter second signal terminal, the pre-filter first signal terminal being coupled with the ASM via a common node 1511. The pre-filter second signal terminal is coupled to the switch 1520 by a signal line 1521. The respective ASM second signal terminal of the depicted five ASM second signal terminals the pre-filter first signal terminal being coupled with defines the common node 1511.

The RF front end module 1501 comprises further a module signal terminal 1580. The pre-filter second signal terminal is coupled to the module signal terminal 1580 via the signal line 1521, the switch 1520 and a signal line 1566. An external filter component 1564 can be coupled to the module signal terminal 1580.

In an aspect, the RF micro acoustic filter 1550 is for band B41 and the external filter component 1564 is for band B7. In an aspect, only one of the bands B7 and B41 is used at a time. The RF micro acoustic filter 1550 having the micro acoustic main-filter 1554 and the external filter component 1564 share the common micro acoustic pre-filter 1552. The common micro acoustic pre-filter 1552 being broad enough to cover the larger of the two bands, i.e., B41, and together with the first RF micro acoustic filter 1550 adapted to the band B41, while the common micro acoustic pre-filter 1552 together with the external filter component 1564 being adapted to the band B7. The switch 1520 couples either the first RF micro acoustic filter 1550 or the external filter component 1564 to the micro acoustic pre-filter 1552. The switch 1520 provides for a flexible structure while needing only one common micro acoustic pre-filter 1552.

The line length of the first signal line 1558 between the common node 1511 and the pre-filter first signal terminal is shorter than a line length of said signal line 1521, the signal line 1556 and via the switch 1520 between the pre-filter second signal terminal and the first main-filter first signal terminal. The line length of the first signal line 1558 between the common node 1511 and the pre-filter first signal terminal is also shorter than a line length of said signal line 1521, via the switch 1520 and the line length 1566 between the pre-filter second signal terminal and the module signal terminal 1580. Placing the RF micro acoustic pre-filter close to the common node 1511 reduces the insertion loss and reduces the loading effect on the filter 1170 and 1480.

In a further aspect the RF micro acoustic filter 1550 is for the receiving side, e.g., receiving band B41 and the external filter component 1564 is for the transmitting side, e.g., transmitting band B41. Thus, the two filters can be adapted to the specific needs of the transmitting and receiving path, for instance with respect to power constraints. The switch 1520 is then set accordingly, i.e., depending on whether the RFFE module is transmitting or receiving (in the example on band B41).

In a further aspect, depending on the needs, the switch 1520 and the micro acoustic pre-filter 1552 can be bypassed using the optional signal lines 1557 and/or 1567. In an aspect, when a HPUE (High Power User Equipment) transmits a SRS (sounding reference signal), e.g., on band B41 (and no band are affected or disturbed) the signal line 1567 can be used (while the switch 1520 is not coupled to the module signal terminal 1580). In a further aspect (not shown), the signal line is not coupled to the ASM 1503 but with a separate switch to the common antenna node 688.

Figure 16:
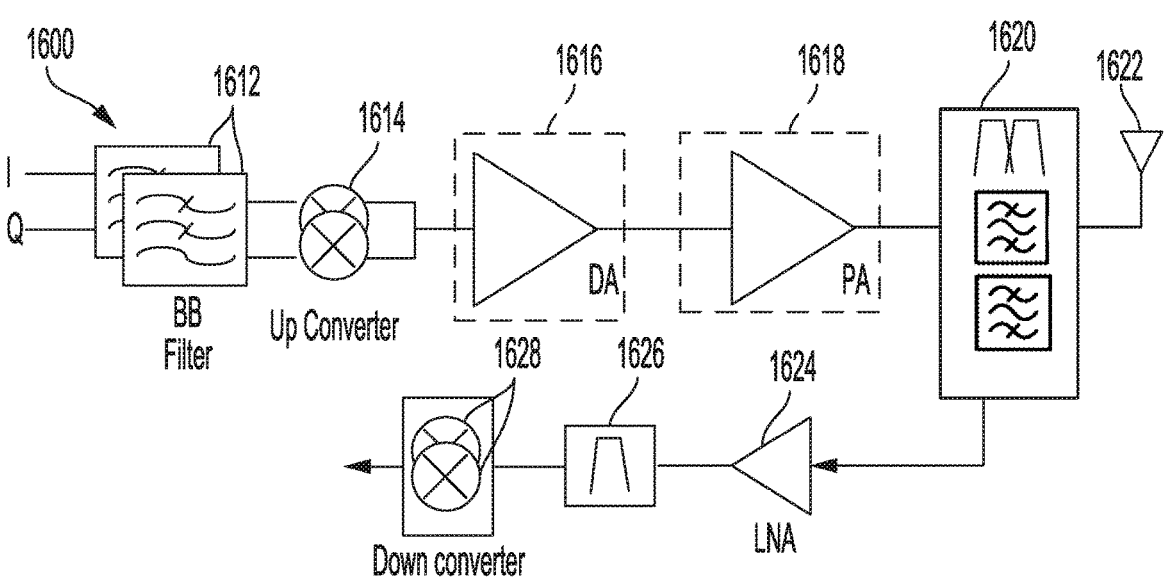
FIG. 16 is a functional block diagram of at least a portion of an example of a simplified wireless transceiver circuit in which the filter circuits and associated multiplexer structures described herein may be employed.

FIG. 16 is a functional block diagram of at least a portion of an aspect of a simplified wireless transceiver circuit 1600 in which the circuit 620 of FIG. 6, or likewise, the RF front end module 1100, 1101, 1102, 1200, 1201, 1202, 1401, 1501 of FIGS. 11A-11C, 12A-12C, 14, 15 may be employed. The transceiver circuit 1600 is configured to receive signals/information for transmission (shown as I and Q values) which is provided to one or more base band filters 1612. The filtered output is provided to one or more mixers 1614. The output from the one or more mixers 1614 is provided to a driver amplifier 1616 whose output is provided to a power amplifier 1618 to produce an amplified signal for transmission. The amplified signal is output to the antenna 1622 through one or more filters 1620 (e.g., duplexers if used as a frequency division duplex transceiver or other filters). The one or more filters 1620 may include the circuit 620 of FIG. 6. The antenna 1622 may be used for both wirelessly transmitting and receiving data. The transceiver circuit 1600 includes a receive path through the one or more filters 1620 to be provided to a low noise amplifier (LNA) 1624 and a further filter 1626 and then down-converted from the receive frequency to a baseband frequency through one or more mixer circuits 1628 before the signal is further processed (e.g., provided to an analog digital converter and then demodulated or otherwise processed in the digital domain). There may be separate filters for the receive circuit (e.g., may have a separate antenna or have separate receive filters) that may be implemented using the circuit 620 of FIG. 6, or likewise, the RF front end module 1100, 1101, 1102, 1200, 1201, 1202, 1401, 1501 of FIGS. 11A-11C, 12A-12C, 14, 15. In an aspect the one or more filters 1620 may be implemented using the modules of FIGS. 11A-11C, 12A-12C, 14, 15.

Figure 17:
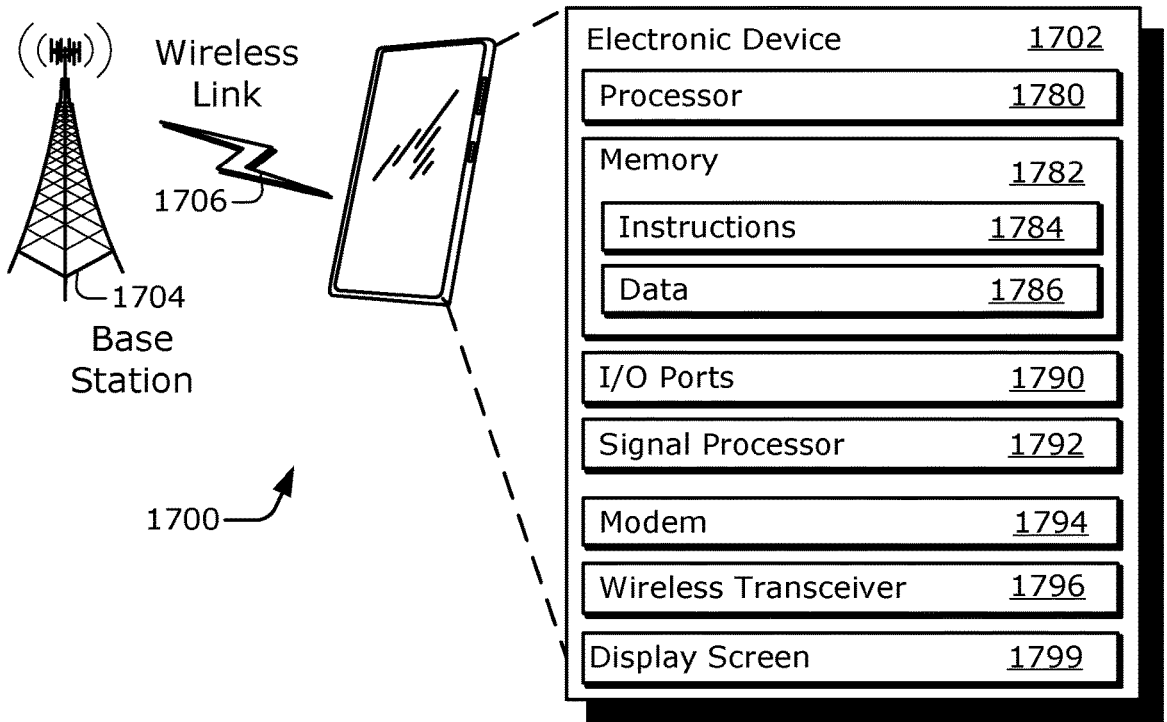
FIG. 17 is a diagram of an environment that includes an electronic device that includes a wireless transceiver such as the transceiver circuit of FIG. 14.

FIG. 17 is a diagram of an environment 1700 that includes an electronic device 1702 that includes a wireless transceiver 1796 such as the transceiver circuit 1600 of FIG. 16. In some aspects, the electronic device 1702 includes a display screen 1799 that can be used to display information associated with data transmitted via wireless link 1706 and processed using components of electronic device 1702 described below. Other aspects of an electronic device in accordance with aspects described herein using a low phase delay filter for multi-band communication can be configured without a display screen. In the environment 1700, the electronic device 1702 communicates with a base station 1704 through a wireless link 1706. As shown, the electronic device 1702 is depicted as a smart phone. However, the electronic device 1702 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, an automobile including a vehicle-based communication system, Internet of Things (IoT) device, sensor or security device, asset tracker, and so forth.

The base station 1704 communicates with the electronic device 1702 via the wireless link 1706, which may be implemented as any suitable type of wireless link. Although depicted as a base station tower of a cellular radio network, the base station 1704 may represent or be implemented as another device, such as a satellite, terrestrial broadcast tower, access point, peer to peer device, mesh network node, fiber optic line, another electronic device generally as described above, and so forth. Hence, the electronic device 1702 may communicate with the base station 1704 or another device via a wired connection, a wireless connection, or a combination thereof. The wireless link 1706 can include a downlink of data or control information communicated from the base station 1704 to the electronic device 1702 and an uplink of other data or control information communicated from the electronic device 1702 to the base station 1704. The wireless link 1706 may be implemented using any suitable communication protocol or standard, such as 3rd Generation Partnership Project Long-Term Evolution (3GPP LTE, 3GPP NR 5G), IEEE 802.11, IEEE 802.16, Bluetooth™, and so forth.

The electronic device 1702 includes a processor 1780 and a memory 1782. The memory 1782 may be or form a portion of a computer readable storage medium. The processor 1780 may include any type of processor, such as an application processor or a multi-core processor, that is configured to execute processor-executable instructions (e.g., code) stored by the memory 1782. The memory 1782 may include any suitable type of data storage media, such as volatile memory (e.g., random access memory (RAM)), non-volatile memory (e.g., Flash memory), optical media, magnetic media (e.g., disk or tape), and so forth. In the context of the disclosure, the memory 1782 is implemented to store instructions 1784, data 1786, and other information of the electronic device 1702, and thus when configured as or part of a computer readable storage medium, the memory 1782 does not include transitory propagating signals or carrier waves.

The electronic device 1702 may also include input/output ports 1790. The I/O ports 1790 enable data exchanges or interaction with other devices, networks, or users or between components of the device.

The electronic device 1702 may further include a signal processor (SP) 1792 (e.g., such as a digital signal processor (DSP)). The signal processor 1792 may function similar to the processor and may be capable executing instructions and/or processing information in conjunction with the memory 1782.

For communication purposes, the electronic device 1702 also includes a modem 1794, a wireless transceiver 1796, and an antenna (not shown). The wireless transceiver 1796 provides connectivity to respective networks and other electronic devices connected therewith using radio-frequency (RF) wireless signals and may include the transceiver circuit 1100 of FIG. 11. The wireless transceiver 1796 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

FIG. 18 illustrates a method 1800 for manufacturing a radio frequency, RF, front end module.

The method comprising placing 1810 on the RF front end module a common antenna node, an antenna switch matrix, ASM, comprising an ASM first signal terminal and at least two ASM second signal terminals, the ASM first signal terminal being coupled with the common antenna node.

The method comprises further placing 1820 at least two RF micro acoustic filters coupleable to the common antenna node via the ASM, wherein at least a first RF micro acoustic filter of the at least two RF micro acoustic filters comprises a micro acoustic pre-filter comprising a pre-filter first signal terminal and a pre-filter second signal terminal, the pre-filter first signal terminal coupled with the ASM, and a micro acoustic main-filter comprising a main-filter first signal terminal and a main-filter second signal terminal.

The method further comprises placing 1830 the micro acoustic pre-filter and the micro acoustic main-filter separated and the pre-filter second signal terminal being coupled to the main-filter first signal terminal by a signal line, the micro acoustic pre-filter being placed on a different die than the micro acoustic main-filter and being coupled by the signal line.

FIG. 19 illustrates a further method 1900 for manufacturing a radio frequency, RF, front end module.

The method comprising placing 1910 on the RF front end module a common antenna node and an antenna switch matrix, ASM, comprising an ASM first signal terminal and at least two ASM second signal terminals, the ASM first signal terminal being coupled with the common antenna node.

The method comprises further placing 1920 at least one RF micro acoustic filter coupleable to the common antenna node via the ASM, the at least a first RF micro acoustic filter comprising a first signal terminal and a second signal terminal.

The method comprises further placing 1930 a module signal terminal adapted to be coupled to a signal terminal of an external filter component.

The method comprises further placing 1940 a micro acoustic pre-filter comprising a pre-filter first signal terminal and a pre-filter second signal terminal, the pre-filter first signal terminal coupled with the ASM.

The method further comprises placing 1950 the micro acoustic pre-filter second signal terminal being coupled with the module signal terminal by a signal line.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. For example, the means for filtering one or more signals may correspond to the plurality of filter circuits 674 of FIG. 6. For example, a first means for filtering may correspond to the first filter element 675a of FIG. 6. A second means for filtering may correspond to the second filter element 675b of FIG. 6. A third means for filtering may correspond to the third filter element 675c of FIG. 6. A fourth means for filtering may correspond to the further filter element 675d of FIG. 6.

Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general-purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The bus may also link various other circuits such as timing sources, peripherals, voltage regulators, power management circuits, and the like.

It is to be understood that the claims are not limited to the precise configuration and components illustrated above. Various modifications, changes and variations may be made in the arrangement, operation and details of the methods and apparatus described above without departing from the scope of the claims.

Implementation examples are described in the following numbered clauses:

Clause 1. A radio frequency (RF) front end module comprising a common antenna node;

an antenna switch matrix (ASM) comprising an ASM first signal terminal and at least two ASM second signal terminals, the ASM first signal terminal being coupled with the common antenna node;

at least two RF micro acoustic filters coupleable to the common antenna node via the ASM, wherein at least a first RF micro acoustic filter of the at least two RF micro acoustic filters comprises:

a micro acoustic pre-filter comprising a pre-filter first signal terminal and a pre-filter second signal terminal, the pre-filter first signal terminal coupled with the ASM; and a micro acoustic main-filter comprising a main-filter first signal terminal and a main-filter second signal terminal;

the micro acoustic pre-filter and the micro acoustic main-filter being separated by a signal line coupling the pre-filter second signal terminal to the main-filter first signal terminal, the micro acoustic pre-filter being on a different die than the micro acoustic main-filter.

Clause 2. The RF front end module of clause 1, wherein a line length between a common node and the pre-filter first signal terminal is shorter than a line length of the signal line between the pre-filter second signal terminal and the main-filter first signal terminal, the common node coupled to at least one of the at least two ASM second signal terminals.

Clause 3. The RF front end module of clause 2, wherein the pre-filter first signal terminal is coupled with a respective ASM second signal terminal of the at least two ASM second signal terminals and the respective ASM second signal terminal defines the common node.

Clause 4. The RF front end module of clause 2, wherein the pre-filter first signal terminal is coupled with a first signal line with the common node and a micro acoustic filter of the at least two RF micro acoustic filters is coupled with a second signal line with the common node, the common node being coupled with a further signal line with the respective ASM second signal terminal.

Clause 5. The RF front end module of clause 2, wherein the pre-filter first signal terminal is coupled at a coupling node with the ASM first signal terminal, wherein said coupling node defines the common node.

Clause 6. The RF front end module of clauses 2-5, wherein at least one micro acoustic filter of the at least two RF micro acoustic filters comprises:

a respective micro acoustic pre-filter comprising a respective pre-filter first signal terminal and a respective pre-filter second signal terminal, and a respective micro acoustic main-filter comprising a respective main-filter first signal terminal and a respective main-filter second signal terminal.

Clause 7. The RF front end module of clause 6, wherein the micro acoustic pre-filter and the respective micro acoustic pre-filter, are on the same die.

Clause 8. The RF front end module of clause 6, wherein a sum of line lengths between the common node and all of the pre-filter first signal terminals is shorter than a sum of line lengths between all of the pre-filter second signal terminals and the respective main-filter first signal terminals.

Clause 9. The RF front end module of clauses 1-8, the micro acoustic pre-filter comprising one first filter stage, the first filter stage being one series resonator or the first filter stage being one shunt resonator.

Clause 10. The RF front end module of clauses 1-8, wherein the micro acoustic pre-filter has one or more resonators, wherein the total number of the one or more resonators is less than or equal to a number of resonators of the micro acoustic main-filter.

Clause 11. The RF front end module of clauses 1-8, the micro acoustic pre-filter comprising at least two filter stages, the first filter stage of the at least two filter stages being a series resonator.

Clause 12. The RF front end module of clauses 1-8, the micro acoustic pre-filter comprising at least one first filter stage, the first filter stage being one series and one shunt resonator.

Clause 13. The RF front end module of clauses 1-12, wherein the micro acoustic pre-filter is a bulk acoustic wave (BAW) filter, and the micro acoustic main-filter is a surface acoustic wave (SAW) filter.

Clause 14. The RF front end module of clauses 1-12, wherein the micro acoustic pre-filter and the micro acoustic main-filter are both surface acoustic wave (SAW) filters but have different layer stacks.

Clause 15. The RF front end module of clause 14, wherein the micro acoustic pre-filter is built from a thin film SAW (TF-SAW) layer stack.

Clause 16. The RF front end module of clauses 1-15, wherein the Quality factor of the resonators of the micro acoustic pre-filter is better than or equal to the Quality factor of the resonators of the micro acoustic main-filter.

Clause 17. The RF front end module of any of clauses 1-16, further comprising;

a module signal terminal adapted to be coupled to a signal terminal of an external filter component; and an additional micro acoustic pre-filter comprising an additional pre-filter first signal terminal and an additional pre-filter second signal terminal, wherein the additional pre-filter second signal terminal is coupled to the module signal terminal.

Clause 18. The RF front end module of clause 17, the additional pre-filter first signal terminal being coupleable to the common antenna node.

Clause 19. The RF front end module of clause 17, the additional pre-filter first signal terminal being coupled at a coupling node with the ASM first signal terminal.

Clause 20. The RF front end module of clauses 1-19, further comprising:

a switch, the switch being in the signal line coupling the pre-filter second signal terminal to the main-filter first signal terminal, the switch adapted to couple or decouple the pre-filter second signal terminal and the main-filter first signal terminal;

a second micro acoustic main-filter comprising a second main-filter first signal terminal and a second main-filter second signal terminal, second main-filter first signal terminal coupled to the switch; and the switch adapted to couple the pre-filter second signal terminal and the main-filter first signal terminal and to decouple the pre-filter second signal terminal and the second main-filter first signal terminal, or to decouple the pre-filter second signal terminal and the main-filter first signal terminal and to couple the pre-filter second signal terminal and the second main-filter first signal terminal.

Clause 21. The RF front end module of clauses 1-19, further comprising:

a switch, the switch being in the signal line coupling the pre-filter second signal terminal to the main-filter first signal terminal, the switch adapted to couple or decouple the pre-filter second signal terminal and the main-filter first signal terminal;

a module signal terminal adapted to be coupled to a signal terminal of an external filter component, the module signal terminal coupled to the switch; and the switch adapted to couple the pre-filter second signal terminal and the main-filter first signal terminal and to decouple the pre-filter second signal terminal and the module signal terminal, or to decouple the pre-filter second signal terminal and the main-filter first signal terminal and to couple the pre-filter second signal terminal and the module signal terminal.

Clause 22. A radio frequency (RF) front end module comprising:

a common antenna node;

an antenna switch matrix (ASM) comprising an ASM first signal terminal and at least two ASM second signal terminals, the ASM first signal terminal being coupled with the common antenna node;

at least one RF micro acoustic filter coupleable to the common antenna node via the ASM; a module signal terminal adapted to be coupled to a signal terminal of an external filter component; and a micro acoustic pre-filter comprising a pre-filter first signal terminal and a pre-filter second signal terminal, the pre-filter first signal terminal coupled with the ASM, the micro acoustic pre-filter second signal terminal being coupled with the module signal terminal by a signal line.

Clause 23. The RF front end module of clause 22, wherein a line length between a common node and the pre-filter first signal terminal is shorter than a line length of said signal line between the pre-filter second signal terminal and the module signal terminal.

Clause 24. The RF front end module of clause 23, wherein the pre-filter first signal terminal is coupled with a respective ASM second signal terminal of the at least two ASM second signal terminals and the respective ASM second signal terminal defines the common node.

Clause 25. The RF front end module of clause 23, wherein the pre-filter first signal terminal is coupled with a first signal line with the common node and a micro acoustic filter of the at least one RF micro acoustic filter is coupled with a second signal line with the common node, the common node being coupled with a further signal line with the respective ASM second signal terminal.

Clause 26. The RF front end module of clause 23, wherein the pre-filter first signal terminal is coupled at a coupling node with the ASM first signal terminal, wherein said coupling node defines the common node.

Clause 27. The RF front end module of clauses 22-26, further comprising:

a switch, the switch being in the signal line coupling the pre-filter second signal terminal to the module signal terminal, the switch adapted to couple or decouple the pre-filter second signal terminal and the module signal terminal;

a second micro acoustic main-filter comprising a second main-filter first signal terminal and a second main-filter second signal terminal, second main-filter first signal terminal coupled to the switch; and the switch adapted to couple the pre-filter second signal terminal and the module signal terminal and to decouple the pre-filter second signal terminal and the second main-filter first signal terminal, or to decouple the pre-filter second signal terminal and the module signal terminal and to couple the pre-filter second signal terminal and the second main-filter first signal terminal.

Clause 28. A method for a radio frequency (RF) front end module, the method comprising placing on the RF front end module:

a common antenna node;

an antenna switch matrix (ASM) comprising an ASM first signal terminal and at least two ASM second signal terminals, the ASM first signal terminal being coupled with the common antenna node;

at least two RF micro acoustic filters coupleable to the common antenna node via the ASM, wherein at least a first RF micro acoustic filter of the at least two RF micro acoustic filters comprises:

a micro acoustic pre-filter comprising a pre-filter first signal terminal and a pre-filter second signal terminal, the pre-filter first signal terminal coupled with the ASM; and a micro acoustic main-filter comprising a main-filter first signal terminal and a main-filter second signal terminal;

the method further comprising placing the micro acoustic pre-filter and the micro acoustic main-filter to be separated from each other and the pre-filter second signal terminal being coupled to the main-filter first signal terminal by a signal line, the micro acoustic pre-filter being placed on a different die than the micro acoustic main-filter and being coupled by the signal line.

Clause 29. The method of clause 28, wherein the placing the micro acoustic pre-filter comprises placing the micro acoustic pre-filter such that a line length between a common node and the pre-filter first signal terminal is shorter than a line length between the pre-filter second signal terminal and the main-filter first signal terminal.

Clause 30. The method of clause 29, wherein the pre-filter first signal terminal is coupled with a respective ASM second signal terminal of the at least two ASM second signal terminals and the respective ASM second signal terminal defines the common node.

Clause 31. The method of clause 29, wherein the placing the micro acoustic pre-filter comprises placing the pre-filter first signal terminal being coupled with a first signal line with the common node and a micro acoustic filter of the at least two RF micro acoustic filters being coupled with a second signal line with the common node, the common node being coupled with a further signal line with the respective ASM second signal terminal.

Clause 32. The method of clause 29, wherein the pre-filter first signal terminal is coupled at a coupling node with the ASM first signal terminal, wherein said coupling node defines the common node.

Clause 33. The method of clauses 29-32, further comprising placing:

at least one further RF micro acoustic filter, said at least one further RF micro acoustic filter comprising a respective micro acoustic pre-filter comprising a respective pre-filter first signal terminal and a respective pre-filter second signal terminal, and a respective micro acoustic main-filter a respective main-filter first signal terminal and a respective main-filter second signal terminal;

the method further comprising placing the micro acoustic pre-filters such that a sum of line lengths between the common node and the all of the pre-filter first signal terminals is shorter than a sum of line lengths between the all of the pre-filter second signal terminals and the respective main-filter first signal terminals.

Clause 34. The method of clauses 29-33, further comprising placing:

a switch, the switch being in the signal line coupling the pre-filter second signal terminal to the main-filter first signal terminal, the switch adapted to couple or decouple the pre-filter second signal terminal and the main-filter first signal terminal;

a second micro acoustic main-filter comprising a second main-filter first signal terminal and a second main-filter second signal terminal, second main-filter first signal terminal coupled to the switch; and the switch adapted to couple the pre-filter second signal terminal and the main-filter first signal terminal and to decouple the pre-filter second signal terminal and the second main-filter first signal terminal, or to decouple the pre-filter second signal terminal and the main-filter first signal terminal and to couple the pre-filter second signal terminal and the second main-filter first signal terminal.

Clause 35. The method of clauses 29-33, further comprising placing:

a switch, the switch being in the signal line coupling the pre-filter second signal terminal to the main-filter first signal terminal, the switch adapted to couple or decouple the pre-filter second signal terminal and the main-filter first signal terminal;

a module signal terminal adapted to be coupled to a signal terminal of an external filter component, the module signal terminal coupled to the switch; and the switch adapted to couple the pre-filter second signal terminal and the main-filter first signal terminal and to decouple the pre-filter second signal terminal and the module signal terminal, or to decouple the pre-filter second signal terminal and the main-filter first signal terminal and to couple the pre-filter second signal terminal and the module signal terminal.

Clause 36. A method for a radio frequency (RF) front end module, the method comprising placing on the RF front end module:

a common antenna node;

an antenna switch matrix (ASM) comprising an ASM first signal terminal and at least two ASM second signal terminals, the ASM first signal terminal being coupled with the common antenna node;

at least one RF micro acoustic filter coupleable to the common antenna node via the ASM, the at least a first RF micro acoustic filter comprising a first signal terminal and a second signal terminal;

a module signal terminal adapted to be coupled to a signal terminal of an external filter component; and a micro acoustic pre-filter comprising a pre-filter first signal terminal and a pre-filter second signal terminal, the pre-filter first signal terminal coupled with the ASM;

the method further comprising placing the micro acoustic pre-filter second signal terminal being coupled with the module signal terminal by a signal line.

Clause 37. The method of clause 36, wherein a line length between a common node and the pre-filter first signal terminal is shorter than a line length of said signal line between the pre-filter second signal terminal and the module signal terminal.

Clause 38. The method of clause 37, wherein the pre-filter first signal terminal is coupled with a respective ASM second signal terminal of the at least two ASM second signal terminals and the respective ASM second signal terminal defines the common node.

Clause 39. The method of clause 37, wherein the pre-filter first signal terminal is coupled with a first signal line with the common node and a micro acoustic filter of the at least one RF micro acoustic filter is coupled with a second signal line with the common node, the common node being coupled with a further signal line with the respective ASM second signal terminal.

Clause 40. The method of clause 37, wherein the pre-filter first signal terminal is coupled at a coupling node with the ASM first signal terminal, wherein said coupling node defines the common node.

Clause 41. The method of clauses 36-40, further comprising placing:

a switch, the switch being in the signal line coupling the pre-filter second signal terminal to the module signal terminal, the switch adapted to couple or decouple the pre-filter second signal terminal and the module signal terminal;

a second micro acoustic main-filter comprising a second main-filter first signal terminal and a second main-filter second signal terminal, second main-filter first signal terminal coupled to the switch; and the switch adapted to couple the pre-filter second signal terminal and the module signal terminal and to decouple the pre-filter second signal terminal and the second main-filter first signal terminal, or to decouple the pre-filter second signal terminal and the module signal terminal and to couple the pre-filter second signal terminal and the second main-filter first signal terminal.

Clause 42. A radio frequency (RF) front end module comprising:

a common antenna node;

means for antenna switching (MAS) comprising an MAS first signal terminal and at least two MAS second signal terminals, the MAS first signal terminal being coupled with the common antenna node;

at least two means for micro acoustic filtering coupleable to the common antenna node via the MAS, wherein at least first means for micro acoustic filtering of the at least two means for micro acoustic filtering comprises:

means for micro acoustic pre-filtering comprising a pre-filter first signal terminal and a pre-filter second signal terminal, the pre-filter first signal terminal coupled with the MAS; and means for micro acoustic main-filtering comprising a main-filter first signal terminal and a main-filter second signal terminal;

the means for micro acoustic pre-filtering and the means for micro acoustic main-filtering being separated by a signal line coupling the pre-filter second signal terminal to the main-filter first signal terminal, the means for micro acoustic pre-filtering being on a different die than the means for micro acoustic main-filtering.

Clause 43. A radio frequency (RF) front end module comprising:

a common antenna node;

means for antenna switching (MAS) comprising an MAS first signal terminal and at least two MAS second signal terminals, the MAS first signal terminal being coupled with the common antenna node;

at least one means for micro acoustic filtering coupleable to the common antenna node via the MAS;

a module signal terminal adapted to be coupled to a signal terminal of external means for filtering; and means for micro acoustic pre-filtering comprising a pre-filter first signal terminal and a pre-filter second signal terminal, the pre-filter first signal terminal coupled with the MAS, the micro acoustic pre-filter second signal terminal being coupled with the module signal terminal by a signal line.

Clause 44. The radio frequency front end module of any of the clauses 1-27, wherein the radio frequency front end module provides a multiplexer configuration.

Within the present disclosure, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a DC ground or an AC ground, and thus the term "ground" covers both possibilities.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples described herein but is to be accorded the widest scope consistent with the principles and novel features disclosed herein.

What is claimed is:

1. A radio frequency (RF) front end module comprising:

a common antenna node;

an antenna switch matrix (ASM) comprising an ASM first signal terminal and at least two ASM second signal terminals, the ASM first signal terminal being coupled with the common antenna node;

at least two RF micro acoustic filters coupled to the common antenna node via the ASM, wherein at least a first RF micro acoustic filter of the at least two RF micro acoustic filters comprises:

a micro acoustic pre-filter comprising a pre-filter first signal terminal and a pre-filter second signal terminal, the pre-filter first signal terminal coupled with the ASM; and a micro acoustic main-filter comprising a main-filter first signal terminal and a main-filter second signal terminal;

the micro acoustic pre-filter and the micro acoustic main-filter being separated by a signal line coupling the pre-filter second signal terminal to the main-filter first signal terminal, the micro acoustic pre-filter being on a different die than the micro acoustic main-filter.

2. The RF front end module of claim 1, wherein a line length between a common node and the pre-filter first signal terminal is shorter than a line length of the signal line between the pre-filter second signal terminal and the main-filter first signal terminal, the common node coupled to at least one of the at least two ASM second signal terminals.

3. The RF front end module of claim 2, wherein the pre-filter first signal terminal is coupled with a respective ASM second signal terminal of the at least two ASM second signal terminals and the respective ASM second signal terminal defines the common node.

4. The RF front end module of claim 2, wherein the pre-filter first signal terminal is coupled with a first signal line with the common node and a micro acoustic filter of the at least two RF micro acoustic filters is coupled with a second signal line with the common node, the common node being coupled with a further signal line with a respective ASM second signal terminal.

5. The RF front end module of claim 2, wherein the pre-filter first signal terminal is coupled at a coupling node with the ASM first signal terminal, wherein said coupling node defines the common node.

6. The RF front end module of claim 2, wherein at least one micro acoustic filter of the at least two RF micro acoustic filters comprises:

a respective micro acoustic pre-filter comprising a respective pre-filter first signal terminal and a respective pre-filter second signal terminal, and a respective micro acoustic main-filter comprising a respective main-filter first signal terminal and a respective main-filter second signal terminal.

7. The RF front end module of claim 6, wherein the micro acoustic pre-filter and the respective micro acoustic pre-filter, are on a same die.

8. The RF front end module of claim 6, wherein a sum of line lengths between the common node and all of the pre-filter first signal terminals is shorter than a sum of line lengths between all of the pre-filter second signal terminals and the respective main-filter first signal terminals.

9. The RF front end module of claim 1, the micro acoustic pre-filter comprising one first filter stage, the first filter stage being one series resonator.

10. The RF front end module of claim 1, the micro acoustic pre-filter comprising one first filter stage, the first filter stage being one shunt resonator.

11. The RF front end module of claim 1, wherein the micro acoustic pre-filter has one or more resonators, wherein a total number of the one or more resonators is less than or equal to a number of resonators of the micro acoustic main-filter.

12. The RF front end module of claim 1, the micro acoustic pre-filter comprising at least two filter stages, a first filter stage of the at least two filter stages being a series resonator.

13. The RF front end module of claim 1, the micro acoustic pre-filter comprising at least one first filter stage, the first filter stage being one series and one shunt resonator.

14. The RF front end module of claim 1, wherein the micro acoustic pre-filter is a bulk acoustic wave (BAW) filter, and the micro acoustic main-filter is a surface acoustic wave (SAW) filter.

15. The RF front end module of claim 1, wherein the micro acoustic pre-filter and the micro acoustic main-filter are both surface acoustic wave (SAW) filters but have different layer stacks.

16. The RF front end module of claim 15, wherein the micro acoustic pre-filter is built from a thin film SAW (TF-SAW) layer stack.

17. The RF front end module of claim 1, wherein a Quality factor of resonators of the micro acoustic pre-filter is better than the Quality factor of resonators of the micro acoustic main-filter.

18. The RF front end module of claim 1, further comprising;

a module signal terminal adapted to be coupled to a signal terminal of an external filter component; and an additional micro acoustic pre-filter comprising an additional pre-filter first signal terminal and an additional pre-filter second signal terminal, wherein the additional pre-filter second signal terminal is coupled to the module signal terminal.

19. The RF front end module of claim 18, the additional pre-filter first signal terminal being coupled to the common antenna node.

20. The RF front end module of claim 18, the additional pre-filter first signal terminal being coupled at a coupling node with the ASM first signal terminal.

21. The RF front end module of claim 1, further comprising:

a switch, the switch being in the signal line coupling the pre-filter second signal terminal to the main-filter first signal terminal, the switch adapted to couple or decouple the pre-filter second signal terminal and the main-filter first signal terminal;

a second micro acoustic main-filter comprising a second main-filter first signal terminal and a second main-filter second signal terminal, second main-filter first signal terminal coupled to the switch; and the switch adapted to couple the pre-filter second signal terminal and the main-filter first signal terminal and to decouple the pre-filter second signal terminal and the second main-filter first signal terminal, or to decouple the pre-filter second signal terminal and the main-filter first signal terminal and to couple the pre-filter second signal terminal and the second main-filter first signal terminal.

22. The RF front end module of claim 1, further comprising:

a switch, the switch being in the signal line coupling the pre-filter second signal terminal to the main-filter first signal terminal, the switch adapted to couple or decouple the pre-filter second signal terminal and the main-filter first signal terminal;

a module signal terminal adapted to be coupled to a signal terminal of an external filter component, the module signal terminal coupled to the switch; and the switch adapted to couple the pre-filter second signal terminal and the main-filter first signal terminal and to decouple the pre-filter second signal terminal and the module signal terminal, or to decouple the pre-filter second signal terminal and the main-filter first signal terminal and to couple the pre-filter second signal terminal and the module signal terminal.

23. A radio frequency (RF) front end module comprising:

a common antenna node;

an antenna switch matrix (ASM) comprising an ASM first signal terminal and at least two ASM second signal terminals, the ASM first signal terminal being coupled with the common antenna node;

a further switch different from the ASM;

at least one RF micro acoustic filter coupled to the common antenna node via the ASM;

a module signal terminal adapted to be coupled to a signal terminal of an external filter component; and a micro acoustic pre-filter comprising a pre-filter first signal terminal and a pre-filter second signal terminal, the pre-filter first signal terminal coupled with the ASM, the micro acoustic pre-filter second signal terminal coupled with the module signal terminal by a signal line via the further switch.

24. The RF front end module of claim 23, wherein a line length between a common node and the pre-filter first signal terminal is shorter than a line length of said signal line between the pre-filter second signal terminal and the module signal terminal.

25. The RF front end module of claim 24, wherein the pre-filter first signal terminal is coupled with a respective ASM second signal terminal of the at least two ASM second signal terminals and the respective ASM second signal terminal defines the common node.

26. The RF front end module of claim 24, wherein the pre-filter first signal terminal is coupled with a first signal line with the common node and a micro acoustic filter of the at least one RF micro acoustic filter is coupled with a second signal line with the common node, the common node being coupled with a further signal line with a respective ASM second signal terminal.

27. The RF front end module of claim 24, wherein the pre-filter first signal terminal is coupled at a coupling node with the ASM first signal terminal, wherein said coupling node defines the common node.

28. A method for a radio frequency (RF) front end module, the method comprising placing on the RF front end module:

a common antenna node;

an antenna switch matrix (ASM) comprising an ASM first signal terminal and at least two ASM second signal terminals, the ASM first signal terminal being coupled with the common antenna node;

at least two RF micro acoustic filters coupled to the common antenna node via the ASM, wherein at least a first RF micro acoustic filter of the at least two RF micro acoustic filters comprises:

a micro acoustic pre-filter comprising a pre-filter first signal terminal and a pre-filter second signal terminal, the pre-filter first signal terminal coupled with the ASM; and a micro acoustic main-filter comprising a main-filter first signal terminal and a main-filter second signal terminal;

the method further comprising placing the micro acoustic pre-filter and the micro acoustic main-filter to be separated from each other and the pre-filter second signal terminal being coupled to the main-filter first signal terminal by a signal line, the micro acoustic pre-filter being placed on a different die than the micro acoustic main-filter and being coupled by the signal line.

29. The method of claim 28, wherein the placing the micro acoustic pre-filter comprises placing the micro acoustic pre-filter such that a line length between a common node and the pre-filter first signal terminal is shorter than a line length between the pre-filter second signal terminal and the main-filter first signal terminal.

30. A radio frequency (RF) front end module comprising:

a common antenna node;

means for antenna switching (MAS) comprising an MAS first signal terminal and at least two MAS second signal terminals, the MAS first signal terminal being coupled with the common antenna node;

at least two means for micro acoustic filtering coupled to the common antenna node via the MAS, wherein at least first means for micro acoustic filtering of the at least two means for micro acoustic filtering comprises:

means for micro acoustic pre-filtering comprising a pre-filter first signal terminal and a pre-filter second signal terminal, the pre-filter first signal terminal coupled with the MAS; and means for micro acoustic main-filtering comprising a main-filter first signal terminal and a main-filter second signal terminal;

the means for micro acoustic pre-filtering and the means for micro acoustic main-filtering being separated by a signal line coupling the pre-filter second signal terminal to the main-filter first signal terminal, the means for micro acoustic pre-filtering being on a different die than the means for micro acoustic main-filtering.

* * * * *